(12) United States Patent
Rhodes

(10) Patent No.: US 7,102,184 B2
(45) Date of Patent: Sep. 5, 2006

(54) IMAGE DEVICE AND PHOTODIODE STRUCTURE

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 10/694,990

(22) Filed: Oct. 29, 2003

(65) Prior Publication Data

US 2004/0251481 A1  Dec. 16, 2004

Related U.S. Application Data

(60) Provisional application No. 60/478,466, filed on Jun. 16, 2003.

(51) Int. Cl.
  *H01L 31/062* (2006.01)
(52) U.S. Cl. .................. 257/292; 257/292; 257/301; 257/302; 257/304; 257/905; 257/296; 438/243; 438/248; 438/249; 438/258; 438/448
(58) Field of Classification Search ........... 257/296, 257/301, 302, 304, 905, 291, 292, 436, 464, 257/446, 348, 297, 398; 438/243, 248, 249, 438/258, 448
See application file for complete search history.

(56) References Cited

U.S. PATENT DOCUMENTS

| | | | | |
|---|---|---|---|---|
| 5,898,196 A | * | 4/1999 | Hook et al. ................. | 257/292 |
| 6,069,058 A | * | 5/2000 | Hong ......................... | 438/436 |
| 6,417,074 B1 | * | 7/2002 | Kopley et al. .............. | 438/448 |
| 6,483,163 B1 | * | 11/2002 | Isogai et al. ................ | 257/446 |
| 6,794,698 B1 | * | 9/2004 | Perng et al. ................ | 257/296 |

* cited by examiner

*Primary Examiner*—Mai-Huong Tran
(74) *Attorney, Agent, or Firm*—Dickstein Shapiro Morin & Oshinsky

(57) ABSTRACT

The invention provides a photodiode with an increased charge collection area, laterally spaced from an adjacent isolation region. Dopant ions of a first conductivity type with a first impurity concentration form a region surrounding at least part of the isolation region. These dopant ions are further surrounded by dopant ions of the first conductivity type with a second impurity concentration. The resulting isolation region structure increases the capacitance of the photodiode by allowing the photodiode to possess a greater charge collection region while suppressing the generation of dark current.

63 Claims, 20 Drawing Sheets

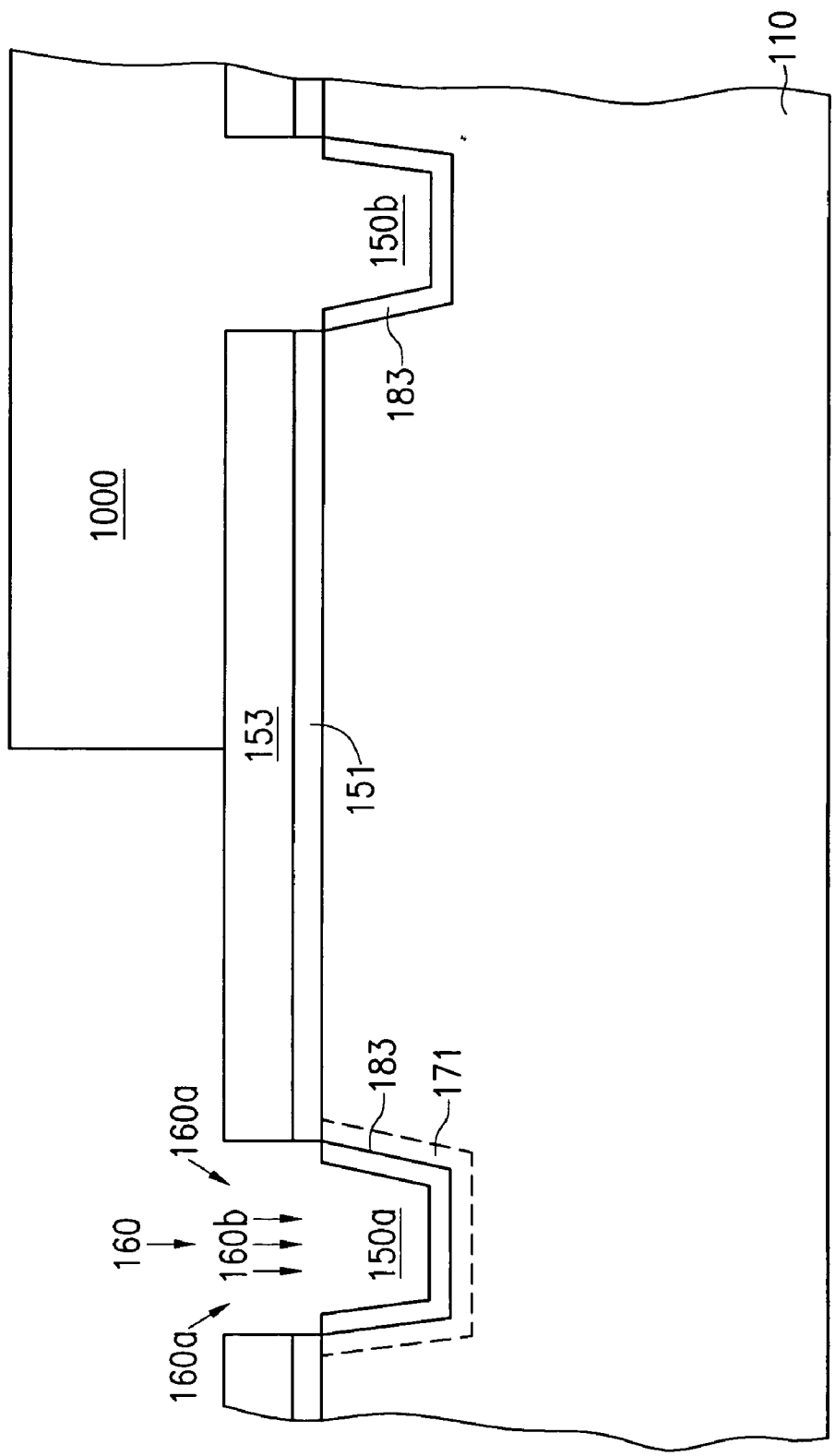

IMAGE DEVICE AND PHOTODIODE STRUCTURE

CROSS REFERENCE TO RELATED APPLICATION

This non-provisional application claims the benefit of provisional application Ser. No. 60/478,466, filed Jun. 16, 2003, which is hereby incorporated by reference.

FIELD OF INVENTION

The present invention relates to the field of semiconductor devices and, in particular, to a CMOS image device and methods of forming a pinned photodiode and resulting photodiode structure.

BACKGROUND OF THE INVENTION

The semiconductor industry currently uses different types of semiconductor-based imagers, including charge coupled devices (CCD) and CMOS imager devices. Because of the inherent limitations in CCD technology, CMOS imagers have been increasingly used as low-cost imaging devices. A fully compatible CMOS sensor technology enabling a higher level of integration of an image array with associated processing circuits is beneficial for many digital applications.

A CMOS image sensor circuit includes a focal plane array of pixel cells, each one of the cells including a photoconversion device, for example, a photogate, photoconductor, or a photodiode for accumulating photogenerated charge in a doped portion of the substrate. A readout circuit is connected to each pixel cell and includes at least an output transistor, which receives photogenerated charges, typically from a doped floating diffusion region, and produces an output signal which is periodically read-out through a row select access transistor. The imager may optionally include a transistor for transferring charge from the photoconversion device to the floating diffusion region or the floating diffusion region may be directly connected to or part of the photoconversion device. A transistor is also typically provided for resetting the floating diffusion region to a predetermined charge level before it receives the photoconverted charges.

In a conventional CMOS imager, the active elements of a pixel cell perform the necessary functions of: (1) photon to charge conversion; (2) accumulation of image charge; (3) transfer of charge to the floating diffusion node; (4) resetting the floating diffusion node to a known state before the transfer of charge to it; (5) selection of a pixel for readout; and (6) output and amplification of signals representing the reset state and a pixel charge signal. Photo-charge may be amplified when it moves from the initial charge accumulation region to the floating diffusion node through a transfer transistor. The charge at the floating diffusion node is converted to a pixel output voltage by the source follower output transistor.

A known three-transistor (3T) CMOS active pixel sensor (APS) design used in many applications contains a photodiode for producing charges which are stored at a diffusion region, a reset transistor for resetting the diffusion region charge, a source follower transistor having a gate connected to the diffusion region for producing an output signal, and a row select transistor for selectively connecting the source follower transistor to a column line of a pixel array. In a four-transistor (4T) CMOS configuration, a transfer transistor is employed to gate charges from the photodiode to the diffusion region.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photogenerated charge collection region 21, in a doped portion of the substrate, for collecting charges generated by light incident on the pixel cell 10. This region 21 is formed as a pinned photodiode 11 (FIG. 2). The photodiode 11 is termed "pinned" because the potential in the photodiode 11 is pinned to a constant value when the photodiode 11 is fully depleted. It should be understood, however, that the CMOS sensor pixel cell 10 may include a photogate or other photon to charge converting device, in lieu of a pinned photodiode 11, as the initial collection region 21 for photogenerated charge.

The CMOS image sensor 10 of FIG. 1 has a transfer transistor with gate 30 for transferring photoelectric charges from the charge collection region 21 to a sensing node 25, typically a floating diffusion region. The sensing node 25 is electrically connected to the gate 50 of an output source follower transistor. The source follower transistor provides an output signal to a row select access transistor having gate 60 for selectively gating the output signal to terminal 32'. A reset transistor having gate 40 resets the sensing node 25 to a predetermined voltage before charge is transferred thereto from the charge collection region 21. The CMOS image sensor 10 of FIG. 1 also includes a n-type region 26 further illustrated in FIG. 2.

A cross-sectional view of the exemplary CMOS image sensor 10 of FIG. 1, taken along line 2–2' is illustrated in FIG. 2.

The exemplary pixel 10 of FIG. 2 employs pinned photodiode 11 having charge collection region 21 for converting photons to charge. The pinned photodiode 11 has a photosensitive p-n-p junction region comprising a p-type surface layer 24, a n-type region 26, within a p-type substrate 20. Impurity doped source/drain regions 22 (FIG. 1) having n-type conductivity, are provided on either side of the transistor gates 40, 50 and 60. The floating diffusion region, e.g., sensing node 25, adjacent to the transfer gate 30 is also preferably n-type. In addition, p-wells 94 are provided on either side of the pinned photodiode 11 in the p-type substrate 20.

Generally, in CMOS image sensors such as CMOS image sensor cell 10 of FIGS. 1–2, incident light causes electrons to accumulate in n-type region 26. A maximum output signal, which is produced by the source follower transistor having gate 50, is proportional to the number of electrons extracted from the region 26. The maximum output signal increases with increased electron capacitance or acceptability of the region 26 to acquire electrons. The electron capacity of pinned photodiodes typically depends on, among other things, the dopants implanted into the photodiode active layer 21. In particular, regions 24, 26 dominate the pinned photodiode's 11 capacitance. Accordingly, increasing the pinned photodiode's 11 capacitance is useful to allow capture of greater levels of photoconverted charges.

Conventionally, trench isolation regions 15 formed in a p-well active layer 94 and adjacent to the charge collection region 21, are used to isolate the pixels. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Trench isolation regions 15 are typically formed by etching trenches into the substrate 20 to provide a physical barrier between adjacent pixels to isolate pixels optically and electrically from one another. The trenches 15 are etched by employing a dry anisotropic or other suitable etching process, and are then filled with a dielectric such as a chemical vapor deposited (CVD) silicon dioxide ($SiO_2$). The filled trenches 15 are then planarized so that the dielectric remains only in the trenches and their top surface remains level with that of the silicon substrate 20.

A common problem associated with the formation of the above-described trench isolation regions 15 is that when ions are implanted in the substrate close to the bottom 17 and sidewalls 16 (FIG. 2) of the trench, current leakage can occur at the junction between the active device regions and the trench. In addition, the dominant crystallographic planes along the bottom 17 and sidewalls 16 of the trench isolation regions 15 have a higher silicon density than the adjacent silicon substrate and, therefore, create a high density of trap sites along the trench bottom 17 and sidewalls 16. These trap sites are normally uncharged but become charged when electrons and holes become trapped in the trap sites. As a result of these trap sites formed along the bottom 17 and sidewalls 16 of the trench isolation regions 15, current generation near and along the trench bottom 17 and sidewalls 16 can be significant. Current generated from trap sites inside or near the photodiode depletion region causes undesired dark current.

Further, for proper operation of the pinned photodiode 11, the p-type surface implant region 24 must be continuously connected using p-type dopants to the p-type substrate 20. FIG. 2 illustrates this as link region 96. Accordingly, a continuous p-type region from p-type surface layer 24 through link region 96 to p-well 94 and on to p-type substrate 20 must be established for the pinned photodiode 11 to work properly. In situations where this does not occur, the surface p-type region 24 becomes isolated from the p-type substrate 20 and results in the p-type surface region 24 to float rather than being pinned. This results in a dramatic loss in the pinned photodiode's 11 capacitance and therefore, decreased image sensor performance.

One solution is to make the p-well region 94 wider so that it overlaps with the surface p-type region 24. However, this requires that the n-region 26 to become smaller. Thereby, pulling the n-region 26 farther away from the p-well region 94. If the n-region 26 is not moved farther from the p-well region 94, the dark current generated by the image sensor is increased.

Reducing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. In addition and as explained above, defects and trap sites inside or near the photodiode depletion region strongly influence the magnitude of dark current generated. In sum, dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

CMOS imagers also typically suffer from poor signal to noise ratios and poor dynamic range as a result of the inability to fully collect and store the electric charge collected in the region 26. Since the size of the pixel electrical signal is very small due to the collection of electrons in the photo array, the signal to noise ratio and dynamic range of the pixel should be as high as possible.

One previous method employed to address dark current is illustrated in FIG. 3A. A pinned photodiode 11 was formed to a predetermined distance away from the active area of the pixel cell 10. However, if the pinned photodiode 11 was less than 0.30μ away from the active area, then the pinned photodiode's 11 dark current has been observed to increase. In particular, the n-region 26 is far removed from the isolation region 15, e.g., greater than 0.30μ, illustrated in FIG. 3B, which is a schematic cross-sectional view of the pixel cell 10 of FIG. 3A taken along line 2–2'. Specifically, the pinned photodiode 11 of FIG. 3, exhibits reduced photodiode capacitance as a result of having a smaller effective charge collection region 21. The pixel cell 10 of FIGS. 3A–3B, however, does exhibit lower dark current at the trade-off of having reduced capacitance.

In another method employed to address dark current concerns, FIG. 4A illustrates that the pinned photodiode 11 was formed to overlap the active area of the pixel cell 10. In particular, the n-region 26 overlaps the isolation region 15 as FIG. 4B illustrates, which is a schematic cross-sectional view of the pixel cell 10 of FIG. 4A taken along line 2–2'. Nonetheless, this pixel design also increased the generation of dark current using a conventionally formed isolation region 15. Specifically, pixel cell 10 has a larger effective charge collection region 21 yielding greater capacitance. The pixel cell 10 of FIGS. 4A–4B, however, exhibits higher dark current at the trade-off of having increased capacitance.

What is required is a means to increase the n-photodiode collection region 26 without causing increased dark current and also achieving a p-type link 96 between the surface p-type region 24 through pwell 94 and to the p-type substrate 20.

There is needed, therefore, an improved active pixel photosensor for use in a CMOS imager that is resistant to dark current and has good photodiode capacitance. An improved isolation region that prevents current generation or current leakage and allows an increased pinned photodiode collection area to be formed closer to the trench isolation region is desired. A method of fabricating an active pixel photosensor exhibiting these characteristics is also needed.

BRIEF SUMMARY OF THE INVENTION

In one aspect, the invention provides an implant of a first conductivity type surrounding an isolation region, which separates pixel cells, and spaced from a doped region of a second conductivity type of a photodiode of the pixel cell. The isolation region surrounded by implants of a first conductivity is formed by conducting an angled or perpendicular p-type implant around the isolation region. The isolation region surrounded by implants of a first conductivity increases the capacitance of the photodiode by allowing the photodiode to be formed with a larger n-type implant charge collection region while suppressing the generation of dark current. The isolation region surrounded by implants of a first conductivity also provides a pixel cell that is resistant to dark current that typically occurs along the bottom and sidewalls of the trench isolation region and further provides good photodiode-to-photodiode isolation.

In another aspect, the invention provides a method of forming an isolation region of a pixel cell surrounded by dopants and adjacent a photodiode of the pixel cell. The isolation region surrounded by dopants is formed by conducting an angled or perpendicular p-type implant around the isolation region. The isolation region is surrounded by implants of a first conductivity, such as p-type dopants, which are implanted at an implant dose of from approximately $3.0 \times 10^{11}$ atoms/cm$^2$ to approximately $3.0 \times 10^{13}$ atoms/cm$^2$, and preferably from approximately $5.0 \times 10^{11}$ atoms/cm$^2$ to approximately $6.0 \times 10^{12}$ atoms/cm$^2$. The area surrounding the isolation region, e.g., the p-well region, surrounded by dopants, also is formed using multiple implants to achieve a graded p-well doping profile of a first conductivity, such as p-type dopants, which are implanted at an implant dose of from approximately $5.0 \times 10^{11}$ atoms/cm$^2$ to approximately $5.0 \times 10^{13}$ atoms/cm$^2$, and preferably from about $1.0 \times 10^{12}$ atoms/cm$^2$ to approximately $1.0 \times 10^{13}$ atoms/cm$^2$. The photodiode p-type surface implant is then formed to be self-aligning and overlapping the photodiode's active area providing good p-surface to p-substrate contact. The p-type surface layer is formed of a first conductivity, such as p-type dopants, which are implanted at an implant dose of from approximately $3.0 \times 10^{12}$ atoms/cm$^2$ to approximately $1.0 \times 10^{14}$ atoms/cm$^2$, and preferably from about $5.0 \times 10^{12}$ atoms/cm$^2$ to approximately $4.0 \times 10^{13}$ atoms/cm$^2$. Accordingly, the charge collection region of the photodiode can be formed self-aligning to the active area and pwell implant edge. In addition, the charge collection region of the photodiode can be formed closer than $0.30\mu$ to trench isolation regions.

These and other features of the invention will be more apparent from the following detailed description that is provided in connection with the accompanying drawings and illustrated exemplary embodiments of the invention.

BRIEF DESCRIPTION OF THE DRAWINGS

FIGS. 6A–6M are schematic cross-sectional views of the CMOS image pixel cell fragment of FIG. 5A illustrating one exemplary fabrication embodiment of the photodiode and isolation region in accordance with the present invention.

DETAILED DESCRIPTION OF THE INVENTION

Figure 1:
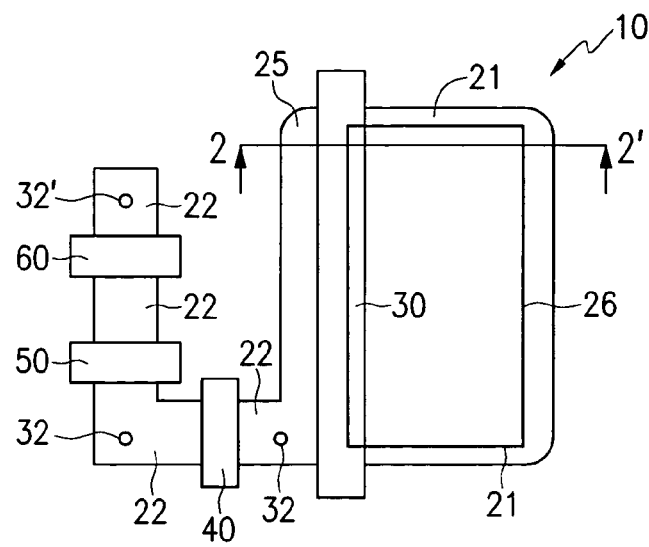
FIG. 1 is a top plan view of an exemplary CMOS image pixel cell.
Figure 2:
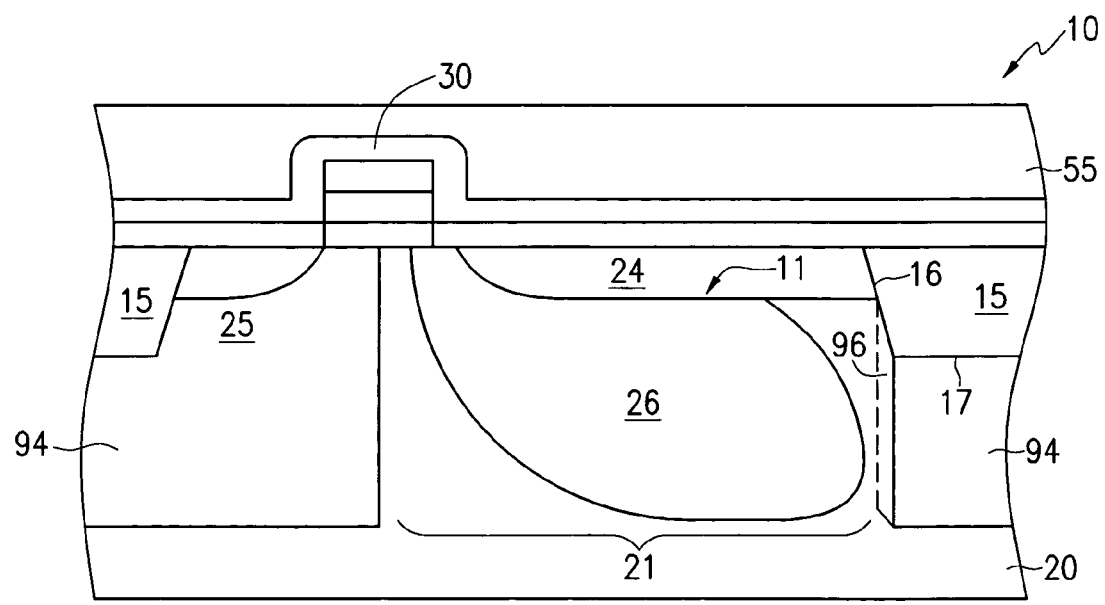
FIG. 2 is a schematic cross-sectional view of the CMOS image pixel cell of FIG. 1 taken along line 2–2'.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and un-doped silicon semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager array will proceed simultaneously in a similar fashion.

For purposes of the present disclosure, the term "angled implantation" or "angled implant" is defined as an implantation conducted at incidence angles with respect to the substrate other than a right angle, that is, at angles other than 0 degrees with respect to the substrate, where a 0 degree implantation is defined to be perpendicular to the substrate. Thus, the term "angled implantation" or "angled implant" refers to implantation conducted at incidence angles with the substrate between 0 degrees to less than 90 degrees.

It should also be appreciated that although the present invention is described below as being employed by a CMOS imager, the methods and structures of the present invention can also be used in other imagers with equal effectiveness, such as a CCD imager.

The invention will now be explained with reference to FIGS. 5A–9. FIGS. 5A–9 illustrate exemplary embodiments of a semiconductor device with an isolation region surrounded by dopants of a first conductivity. The isolation region is adjacent to a pinned photodiode region overlapping the photodiode's active area constructed in accordance with the invention. It should be understood that similar reference numbers correspond to similar elements for FIGS. 5A–9.

It should be noted that, although the invention is described in connection with use in a four-transistor (4T) pixel cell, the invention also has applicability to any CMOS imager including, for example, a three-transistor (3T) cell which differs from the 4T cell in the omission of a transfer transistor gate.

Figure 5A:
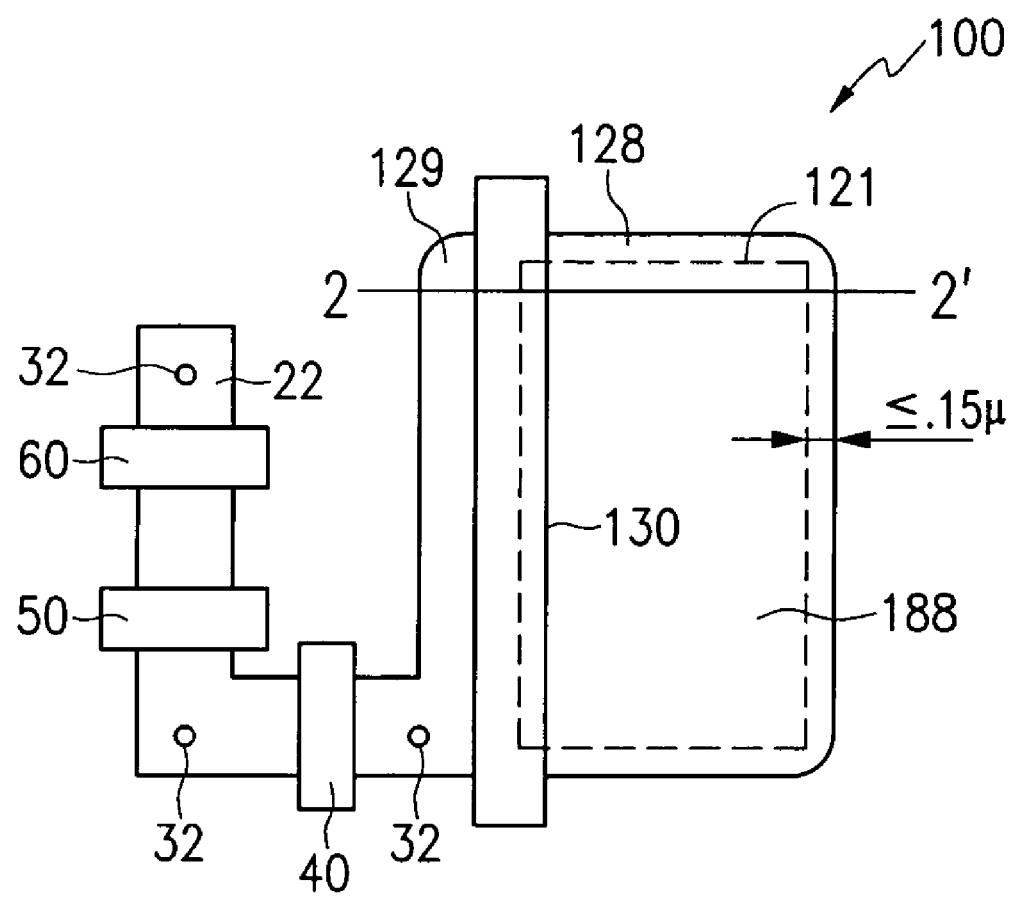
FIG. 5A is a schematic cross-sectional view of a CMOS image pixel cell illustrating a photodiode and isolation region formed in accordance with one exemplary embodiment of the present invention.

FIG. 5A illustrates a schematic top view of a semiconductor wafer fragment of an exemplary CMOS sensor pixel four-transistor (4T) cell 100 constructed in accordance with one exemplary embodiment of the present invention. As it will be described below, the exemplary CMOS sensor pixel cell 100 includes a photo-generated charge collection region 121, in a doped portion of the substrate, for collecting charges generated by light incident on the pixel cell 100. This region 121 is formed as a pinned photodiode 188. It should be understood, however, that the exemplary CMOS sensor pixel cell 100 may include a photogate, photoconductor, or other photon-to-charge converting device, in lieu of a pinned photodiode 188, as the initial charge collection region 121 for photo-generated charge.

The exemplary CMOS image sensor 100 of FIG. 5A has a transfer transistor with gate 130 for transferring photoelectric charges from the charge collection region 121 to a sensing node 129, typically a floating diffusion region. The sensing node 129 is electrically connected to the gate 50 of an output source follower transistor. The source follower transistor provides an output signal to a row select access transistor having gate 60 for selectively gating the output signal to terminal 32'. A reset transistor having gate 40 resets the sensing node 129 to a predetermined voltage before charge is transferred thereto from the charge collection region 121. The active area 128 of the sensor 100 is also illustrated. The exemplary CMOS image sensor 100 of FIG. 5A also includes an n-type region 126 further illustrated in FIG. 5B.

FIG. 5B through FIG. 8 illustrates a semiconductor substrate 110 along a schematic cross-sectional view of the exemplary CMOS image pixel cell 100 illustrated in FIG. 5A taken along line 2–2'.

Figure 5B:
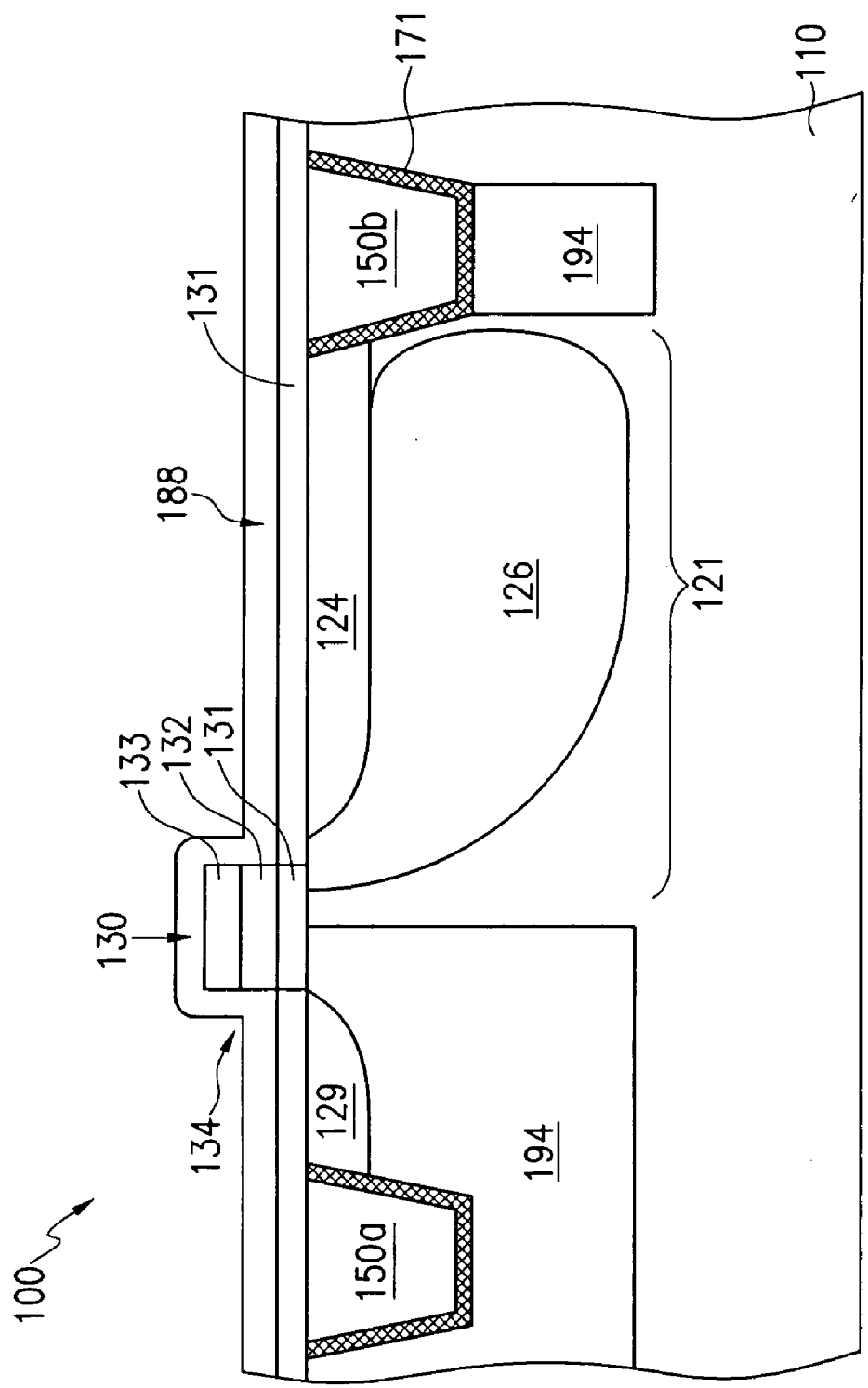
FIG. 5B is a schematic cross-sectional view of the CMOS image pixel cell of FIG. 5A taken along line 2–2' illustrating a photodiode and isolation region formed in accordance with one exemplary embodiment of the present invention.

Referring now to FIG. 5B, a photodiode 188 and isolation region structure 150b constructed in accordance with the methods of the present invention is disclosed. FIG. 5B illustrates a multi-layered transfer transistor gate stack 130 formed over a semiconductor substrate 110. For exemplary purposes, the substrate 110 is a silicon substrate. However, as noted above, the invention has equal utility with other semiconductor substrates.

Still referring to FIG. 5B, the transfer transistor gate stack 130 comprises a first gate oxide layer 131, a conductive layer 132, and a second insulating layer 133. If desired, a silicide layer (not shown) may be also formed in the multi-layered gate stack 130 between the conductive layer 132 and the second insulating layer 133. FIG. 5B also illustrates insulating oxide layer 134. The insulating oxide layer 134 can be used to form sidewall spacers (not shown) on the sides of the transfer transistor gate stack 130 at an earlier or later processing step. Forming a spacer in the region shown in FIG. 5B is not required.

FIG. 5B further illustrates isolation regions 150a and 150b. Isolation region 150b is surrounded by dopant ions 171 of a first conductivity, which for exemplary purposes is p-type. For purposes of a simplified description, isolation region 150b, which is surrounded by dopant ions 171 of a first conductivity type, is described as an enclosed isolation region 150b, which is formed within the substrate 110.

Further, in one exemplary embodiment, the enclosed isolation region 150b is a shallow trench enclosed isolation region. The p-type dopant ions surrounding the shallow trench isolation region 150b are implanted preferably at an implant dose of from approximately $3.0 \times 10^{11}$ atoms/cm$^2$ to approximately $3.0 \times 10^{13}$ atoms/cm$^2$, and preferably from approximately $5.0 \times 10^{11}$ atoms/cm$^2$ to approximately $6.0 \times 10^{12}$ atoms/cm$^2$.

FIG. 5B illustrates p-well regions 194 formed beneath isolation regions 150a and 150b. The area surrounding the isolation region e.g., the p-well region 194, surrounded by dopants, also is formed using multiple implants to achieve a graded p-well doping profile of a first conductivity, such as p-type dopants, which are implanted at an implant dose of from approximately $5.0 \times 10^{11}$ atoms/cm$^2$ to approximately $5.0 \times 10^{13}$ atoms/cm$^2$, and preferably from about $1.0 \times 10^{12}$ atoms/cm$^2$ to approximately $1.0 \times 10^{13}$ atoms/cm$^2$.

FIG. 5B also illustrates a p-n-p photodiode structure 188 formed by regions 124, 110 and 126. The p-type doped region 110 is shown to be the substrate which is p-type doped. This p-type region 110 could also be achieved by implantation or using p-epi wafers. The p-type doped region 110 has a doping concentration of from approximately $1.0 \times 10^{14}$ atoms/cm$^2$ to approximately $1.0 \times 10^{16}$ atoms/cm$^2$ and preferably of from approximately $5.0 \times 10^{14}$ atoms/cm$^2$ to approximately $3.0 \times 10^{15}$ atoms/cm$^2$. The p-type region 110 can be formed by methods known in the art, for instance, by implantation or using p-epi wafers.

The n-type region 126 is formed by implanting dopant ions of a second conductivity type, which for exemplary purposes is n-type, in the area of the substrate 110 directly beneath the active area of the pixel cell. The implanted n-doped region 126 forms a photosensitive charge collection region 121 for collecting photogenerated electrons. Further, the n-doped region 126 can be formed using one or multiple implants to grade the implant profile of the charge collection region 121 e.g., to establish a doping gradient. For instance, the n-doped region 126 can have a higher concentration of n-type dopants near the p-type surface 124 interface than at the p-type doped region 110 interface. Conversely, the n-doped region 126 can have a lower concentration of n-type dopants near the p-type surface 124 interface than at the p-type doped region 110 interface. The n-doped region 126 can also have a uniform dopant concentration such that no doping gradient exists. The total n-type implant dose is from approximately $1.0 \times 10^{12}$ atoms/cm$^2$ to approximately $1.0 \times 10^{14}$ atoms/cm$^2$, and preferably from approximately $2.0 \times 10^{12}$ atoms/cm$^2$ to approximately $1.0 \times 10^{13}$ atoms/cm$^2$.

The p-type pinned surface layer 124 is formed by conducting a dopant implantation with dopant ions of a first conductivity type, which for exemplary purposes is p-type. The implant dose of the p-type pinned surface layer 124 is from approximately $3.0 \times 10^{12}$ atoms/cm$^2$ to approximately $1.0 \times 10^{14}$ atoms/cm$^2$, and preferably from about $5.0 \times 10^{12}$ atoms/cm$^2$ to approximately $4.0 \times 10^{13}$ atoms/cm$^2$. The dopant ions of the p-type pinned surface layer 124 are implanted into the active area of the substrate 110 over the implanted n-type region 126 and between the transfer gate 130 and enclosed shallow trench isolation region 150b.

Accordingly, the p-type pinned surface layer 124, the p-well 194 and the p-type region 171 form a linking region surrounding the trench isolation region 150b. In essence, region 171 electrically links or connects the p-type pinned surface region 124 to the p-well region 194 through the p-type dopant ions of region 171.

The pinned photodiode 188 can be formed self-aligning to the enclosed isolation region 150b and to p-well 194 as a result of the surrounding p-type ions 171. In other words, the presence of region 171 allows a larger n-doped region 126 to be formed. A larger n-doped region 126 correlates to an increased charge collection region 121 which yields higher capacitance and no increase in dark current. Since region 171 permits region 126 to be implanted closer to STI region 150b, STI region 150b can be employed as a self-aligned mask for forming region 126. Accordingly, region 126 can extend over to and partially under STI region 150b, if desired.

Figure 3A:
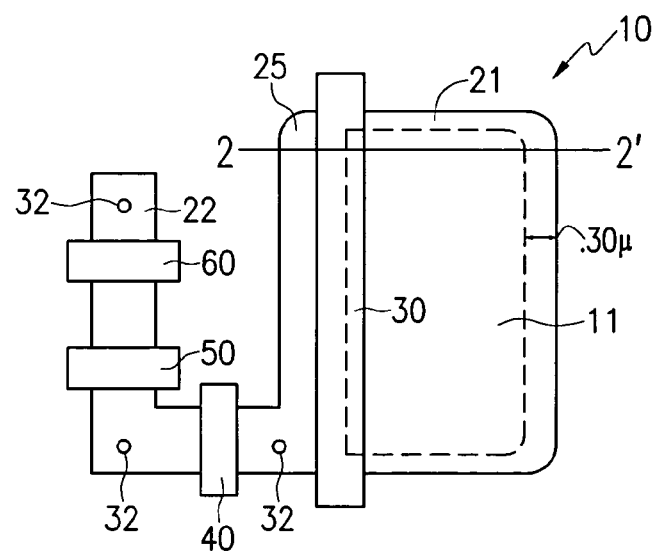
FIG. 3A is a top plan view of an exemplary CMOS image pixel cell with a photodiode spaced from the photodiode's active area.
Figure 3B:
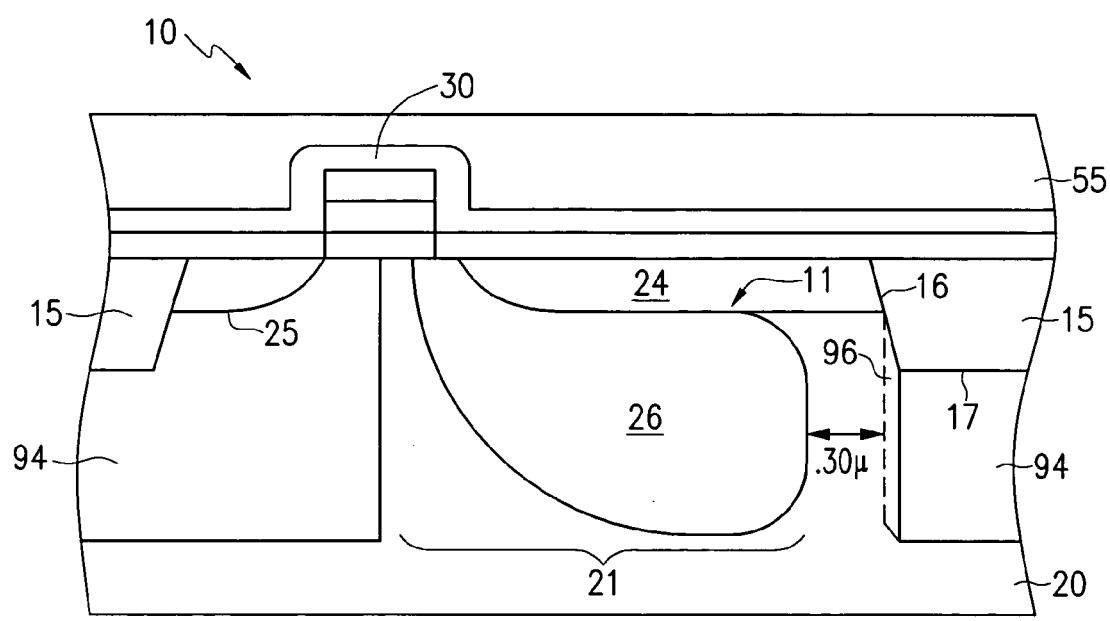
FIG. 3B is a schematic cross-sectional view of the CMOS image pixel cell of FIG. 3A taken along line 2–2'.
Figure 4A:
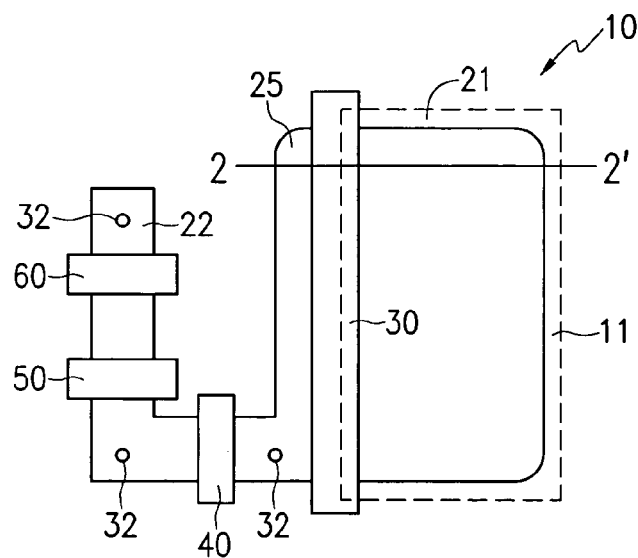
FIG. 4A is a top plan view of an exemplary CMOS image pixel cell with a photodiode overlapping the photodiode's active area.
Figure 4B:
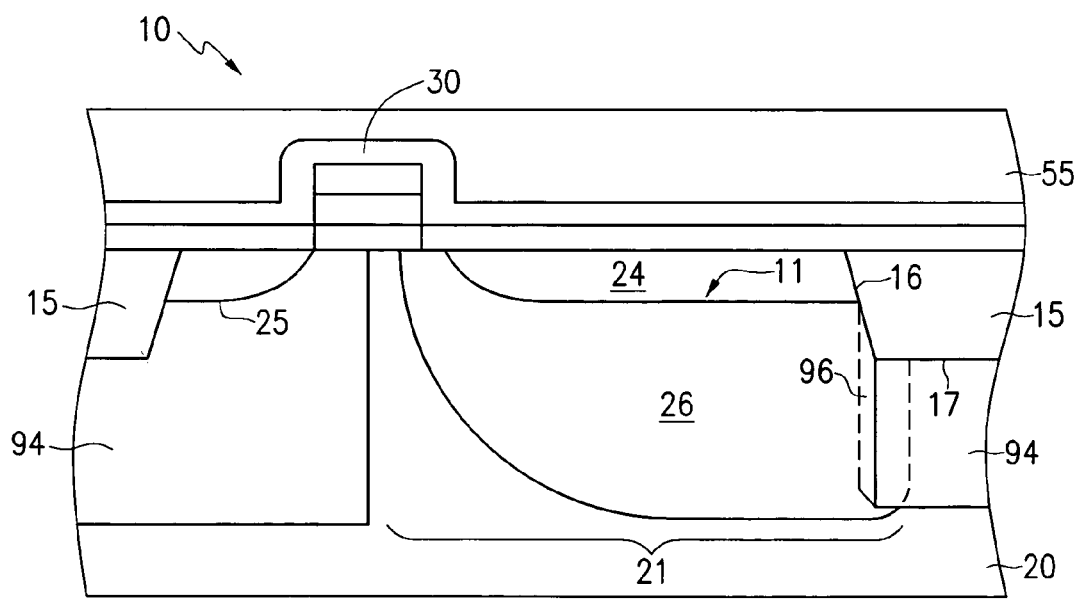
FIG. 4B is a schematic cross-sectional view of the CMOS image pixel cell of FIG. 4A taken along line 2–2'.

The self-aligned photodiode 188 overlaps the photodiode's active area without generating increased dark current. As a result, the pixel cell is more resistant to dark current with the presence of region 171, and the pinned photodiode 188 structure has increased capacitance since the photodiode 188 structure can extend very close to isolation region 150b. For instance, depending upon the p-type implant forming region 171, the n-doped region 126 can be formed less than approximately 0.30μ away from the enclosed shallow trench isolation region 150b, and preferably from approximately 0.15μ to approximately 0.00μ away. In the prior art, as FIGS. 3A–3B illustrate, the pinned photodiode 11 (FIGS. 3A–3B) was formed at least 0.30μ away from the trench isolation region 15 (FIG. 3B).

FIG. 5B also illustrates a n-type floating diffusion region 129 located adjacent the multi-layered gate stack 130 and opposite the n-type doped region 126 of the p-n-p photodiode 188. The multi-layered transfer gate stack 130 transfers charge accumulated in the charge collection region 121 of the photodiode 188 to the floating diffusion region 129.

A method of forming the pixel cell structure 100 of FIGS. 5A–5B will now be described in reference to FIGS. 6A–9.

Figure 6A:
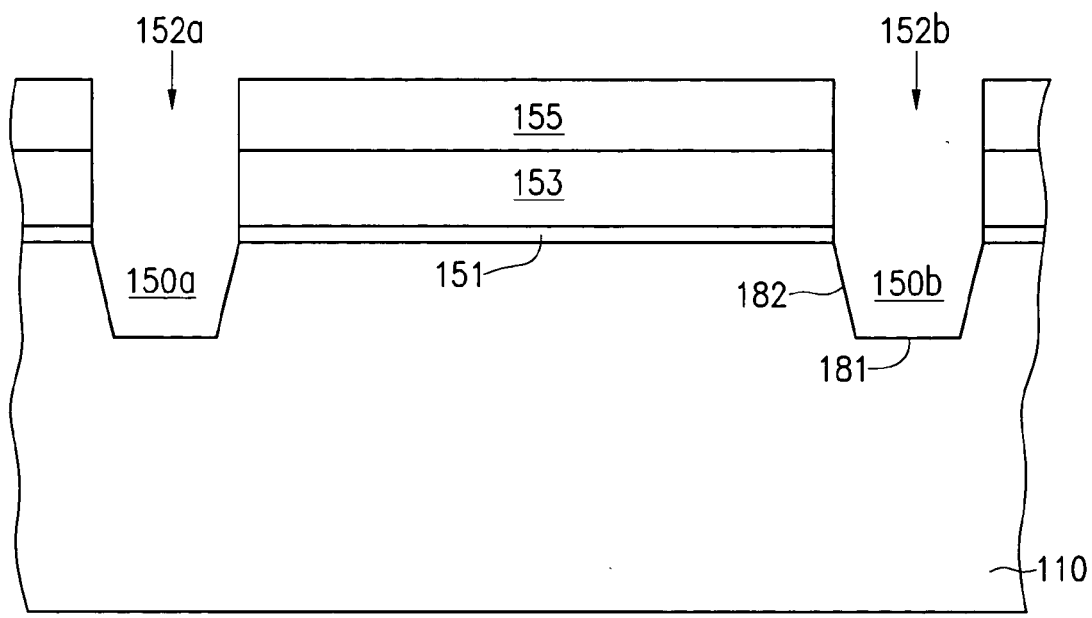

Referring now to FIG. 6A, trench isolation regions 150a and 150b are provided within substrate 110 employing methods well-known in the art. Trench isolation regions 150a, 150b are typically filled with a dielectric material, which may be an oxide material, for example a silicon oxide such as SiO or SiO$_2$, a thermally grown oxide, oxynitride, a nitride material such as silicon nitride, silicon carbide, a high temperature polymer, or other suitable dielectric materials. The dielectric may be also formed of any combination of oxide/nitride, nitride/oxide and oxide/nitride/oxide materials.

In a preferred embodiment, the isolation region 150b is a shallow trench isolation region and the dielectric material is a high density plasma (HDP) oxide, a material which has a high ability to effectively fill narrow trenches.

Although FIGS. 5B–9 illustrate only a portion of the substrate 110 with only two shallow trench isolation regions 150a and 150b, it must be understood that the present invention contemplates the simultaneous formation of a plurality of shallow trench structures at various locations on the substrate 110 to isolate the pixels from one another, and to isolate other pixel array structures.

Figure 6B:
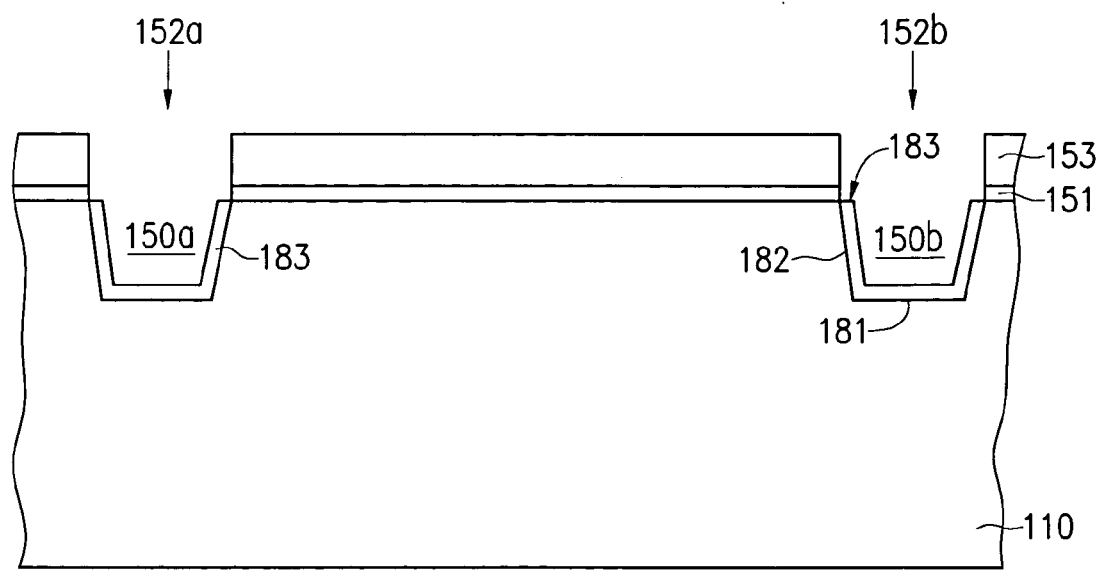

Still referring to FIG. 6A, various layers are provided over the semiconductor substrate 110. A blanket layer 153 of a hard mask material, such as silicon nitride, silicon oxide, or other suitable material, is formed over a barrier oxide layer 151. The barrier oxide is typically a grown oxide but can also be a deposited oxide, such as TEOS or HDP oxide, among others. A photoresist layer 155 is formed over the hard mask layer 153 and then patterned with a mask (not shown) and etched to obtain openings 152a, 152b in layers 151, 153 and 155, as illustrated in FIG. 6B. The silicon is then etched to form trenches 150a and 150b.

Referring to FIG. 6B, the photoresist layer 155 is stripped typically using an oxygen containing plasma. However, other suitable methods can be equally employed. If desired, a thin insulating layer 183 may be formed on the sidewalls 182 and bottom 181 of the trenches 150a, 150b before filling the trenches 150a, 150b with a dielectric material which, as noted, is preferably a high density plasma (HDP) oxide (illustrated in FIG. 6M). The thin insulating layer 183 may be formed as a grown or deposited oxide and/or of silicon nitride or an oxide/nitride combination, for example, to aid in smoothing out the corners in the bottom of the trench and to reduce the amount of stress in the dielectric material used to later fill in the trenches. The optional thin insulating layer 183 is illustrated in FIG. 6B.

It should be appreciated that although the embodiments of the present invention are described with reference to enclosed trench isolation regions 150a, 150b with a thin insulating layer 183 formed on the bottom 181 and sidewalls 182, the invention is not limited to these embodiments, and also contemplates the formation of trench isolation structures 150a, 150b which do not comprise a thin insulating layer formed on the bottom 181 and sidewalls 182.

Figure 6C:
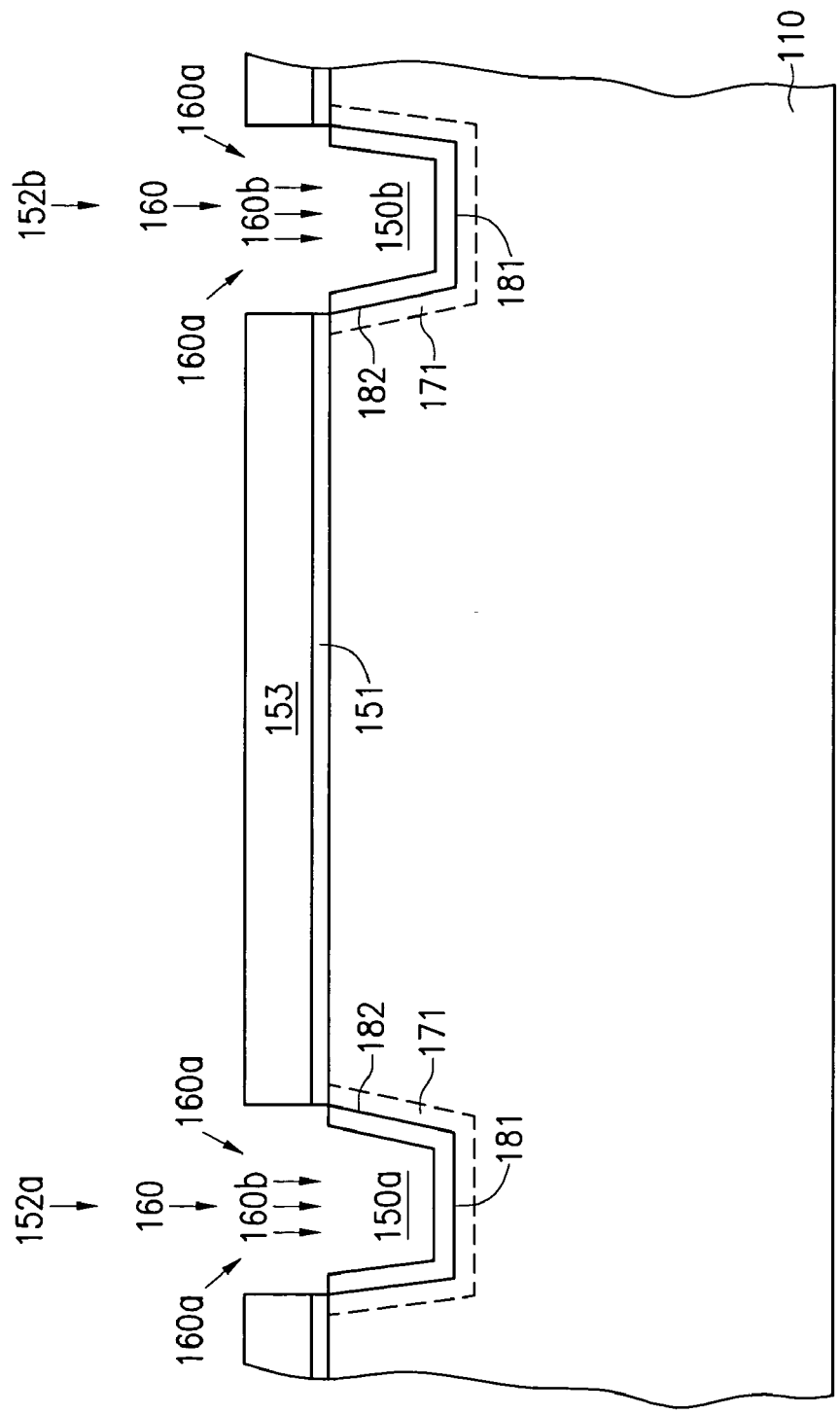

As shown in FIG. 6C, the structure is then subjected to dopant implantations 160 with a dopant ion, which for exemplary purposes is p-type. In this manner, p-type dopant ions are implanted through the openings 152a, 152b to form p-type regions 171 surrounding the isolation regions 150a, 150b. Specifically, p-type ions are implanted into areas of the substrate 110 located below the shallow trench isolation regions (STI) 181 and adjacent to the shallow trench isolation walls 182.

The dopant implantations 160 can be conducted as angled implants 160a and/or a perpendicular implants 160b. For instance, the dopant implantations 160 can be conducted at an implant angle that is from about 0° to about 35°. The p-type isolation implant 160 can be conducted as a blanket implant or a masked implant. The p-type isolation implant 160 is implanted into the p-substrate, or, p-well regions (not illustrated) if present. If n-type dopant ions are used, then the n-type isolation implant would be conducted into an n-substrate or n-well region if present. While FIG. 6C illustrates this p-type isolation implant 160 being conducted after the resist layer 155 is removed, this implantation 160 could also be conducted prior to the removal of the resist layer 155 (FIG. 6A).

Figure 6D:
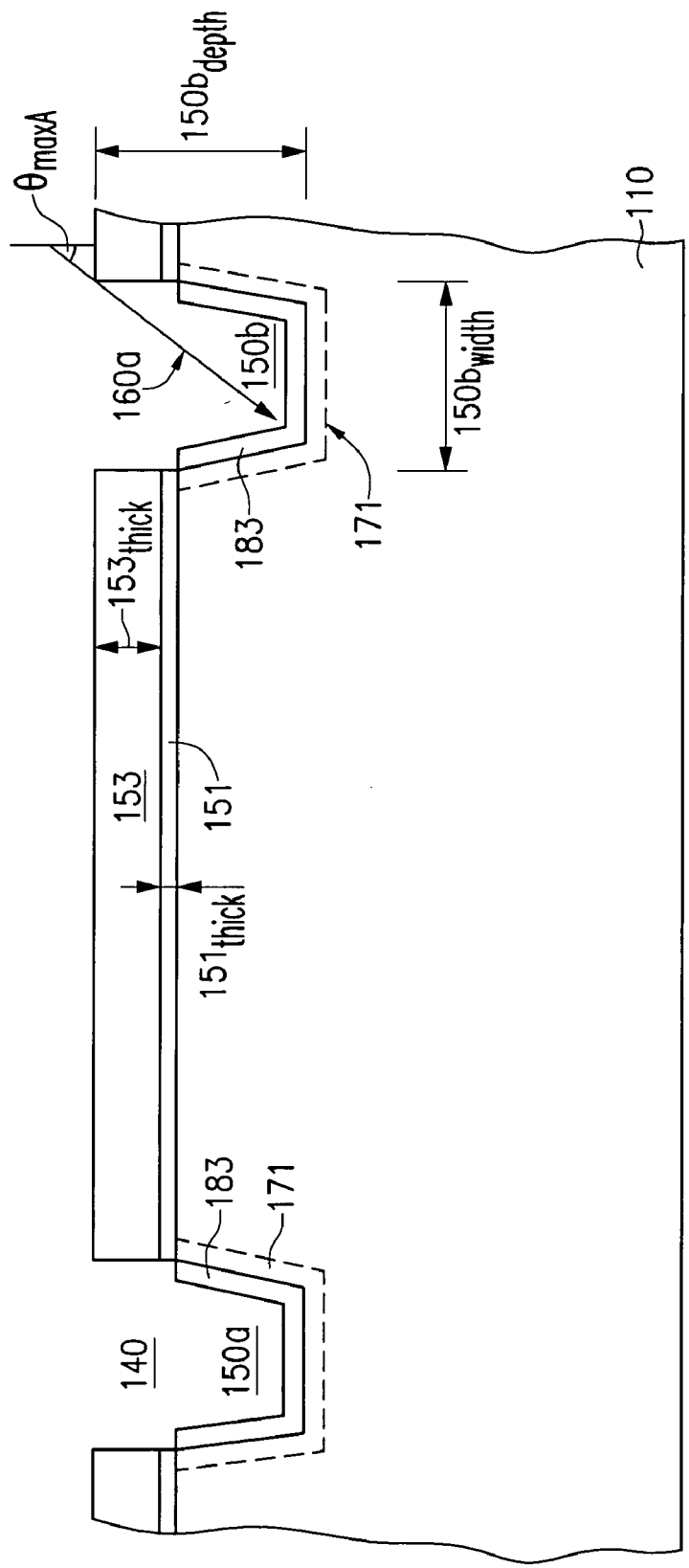

FIG. 6D illustrates calculating the maximum angle of implantation ($\theta_{maxA}$) when an angled implantation 160a is used to form regions 171 after the photoresist layer 155 is removed. For instance, with regard to trench isolation region 150b, $\tan(\theta_{maxA})$ is determined by taking the trench's 150b$_{width}$ width and dividing that by the sum of the blanket layer's 153$_{thick}$ thickness, the oxide layer's 151$_{thick}$ thickness and the trench's 150b$_{depth}$ depth. Methods of calculating the angled implantation 160a ($\theta_{maxA}$) for trench isolation 150a proceeds in an analogous manner. For purposes of a simplified description, methods of calculating the angled implantation 160a ($\theta_{maxA}$) is described in reference to trench isolation region 150b.

Figure 6E:
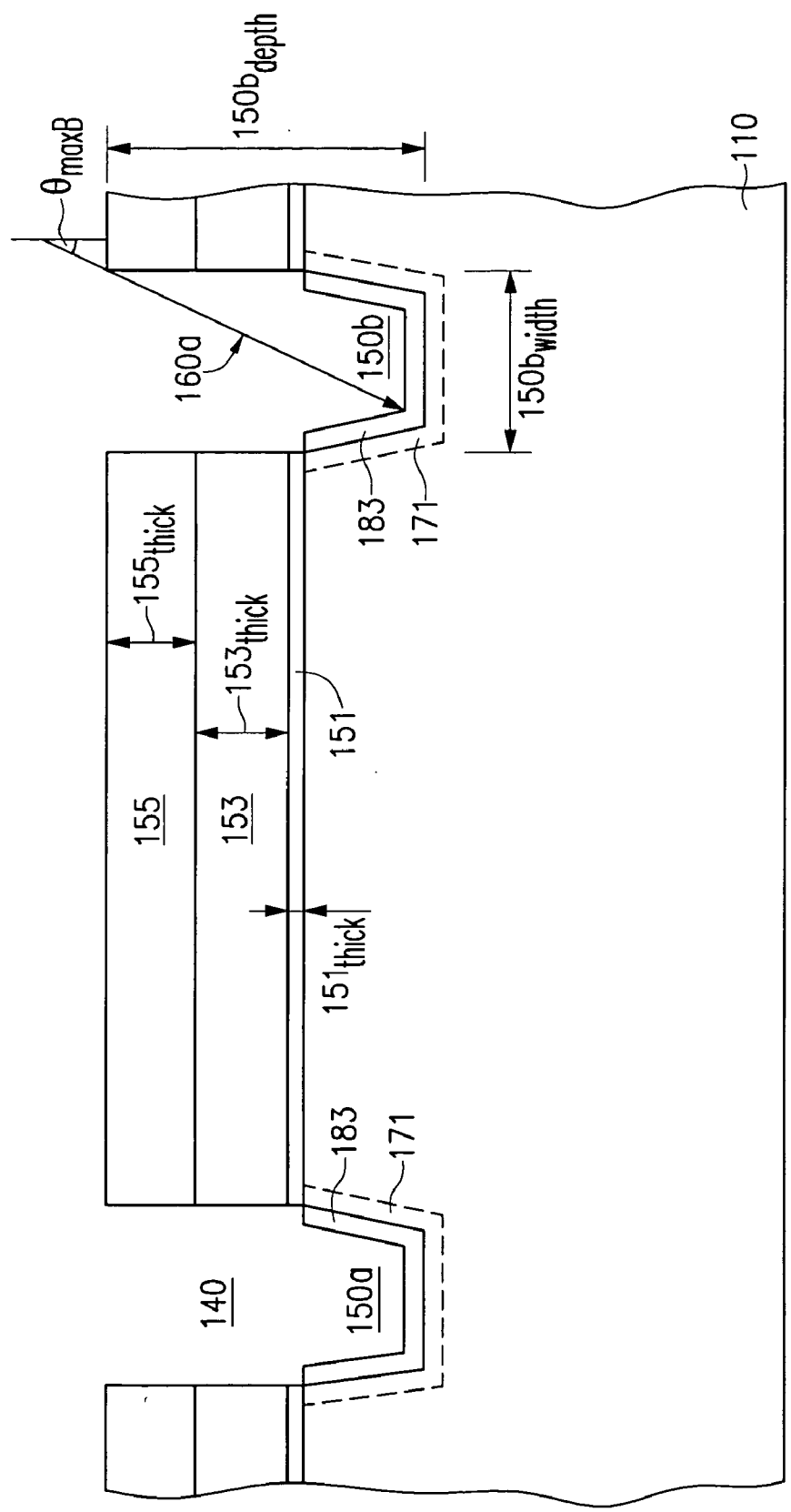

Accordingly, the desired implant angle for angled implantation 160a is from approximately 0°≦implant angle 160b ≦$\theta_{maxA}$. For instance, if the blanket layer 153$_{thick}$ is 1000 Å thick, the oxide layer 151$_{thick}$ is 100 Å thick, the trench's 150b$_{depth}$ is 2000 Å deep and the trench's 150b$_{width}$ width is 2000 Å wide, then $\tan(\theta_{maxA})$ is equal to 2000 Å divided by 3100 Å or 0.645 which corresponds to a ($\theta_{maxA}$) of approximately 33°. Preferably, the angled dopant implantation 160a is from approximately 0°≦implant angle 160b≦33°, and more preferably is from approximately 0°≦implant angle $160b$≦20° for the above-stated thickness and depth conditions FIG. 6E illustrates calculating the maximum angle of implantation ($\theta_{maxB}$) when an angled implantation 160a is used to form regions 171 with the presence of photoresist layer 155. For instance, the tangent of the angle $\theta_{maxB}$, is determined by calculating the trench's $150b_{width}$ width and dividing that by the sum of the thickness of the blanket layer $153_{thick}$, the oxide layer $151_{thick}$, the trench's $150b_{depth}$, and the photoresist's layer $155_{thick}$. Accordingly, the desired implant angle for angled implantation 160a, in this scenario, is from approximately 0°≦implant angle $160b$≦$\theta_{maxB}$.

It should be appreciated that although FIG. 6C illustrates isolation regions 150a, 150b with a p-type region 171, isolation region 150a can be similarly formed prior to or subsequent to forming a p-type region 171 around isolation region 150b by using a masking photoresist 1000 as illustrated in FIG. 6F. In the embodiment shown in FIG. 5B–6E, the STI regions 150a, 150b and the following p-type implant 171 are shown performed at the same time so no masking between regions 150a and 150b is required.

Figure 6G:
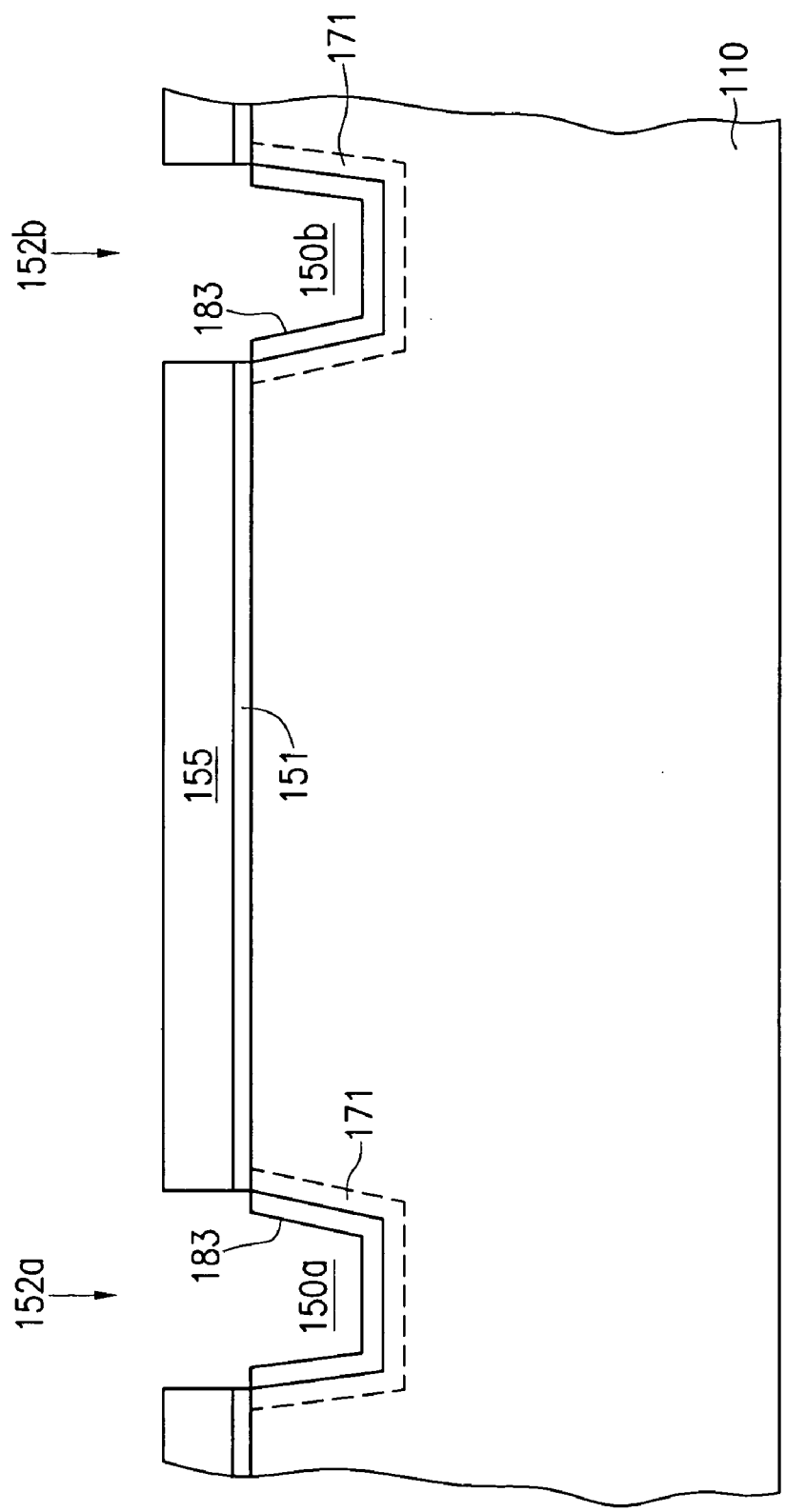

In this embodiment, isolation regions 150a and 150b are formed with a p-type region 171 at the same time as illustrated in FIG. 6G. The calculation of $\theta_{maxA}$ or $\theta_{maxB}$, if an angled implantation 160a is used to form region 171 around isolation region 150a, is similarly determined as FIGS. 6D and 6E illustrate. Moreover, isolation region 150a or 150b can be formed without a p-type region 171, if desired. For purposes of a simplified description, FIGS. 6H–6I are described as forming isolation regions 150a and 150b with p-type regions 171 as FIG. 6G illustrates.

Figure 6H:
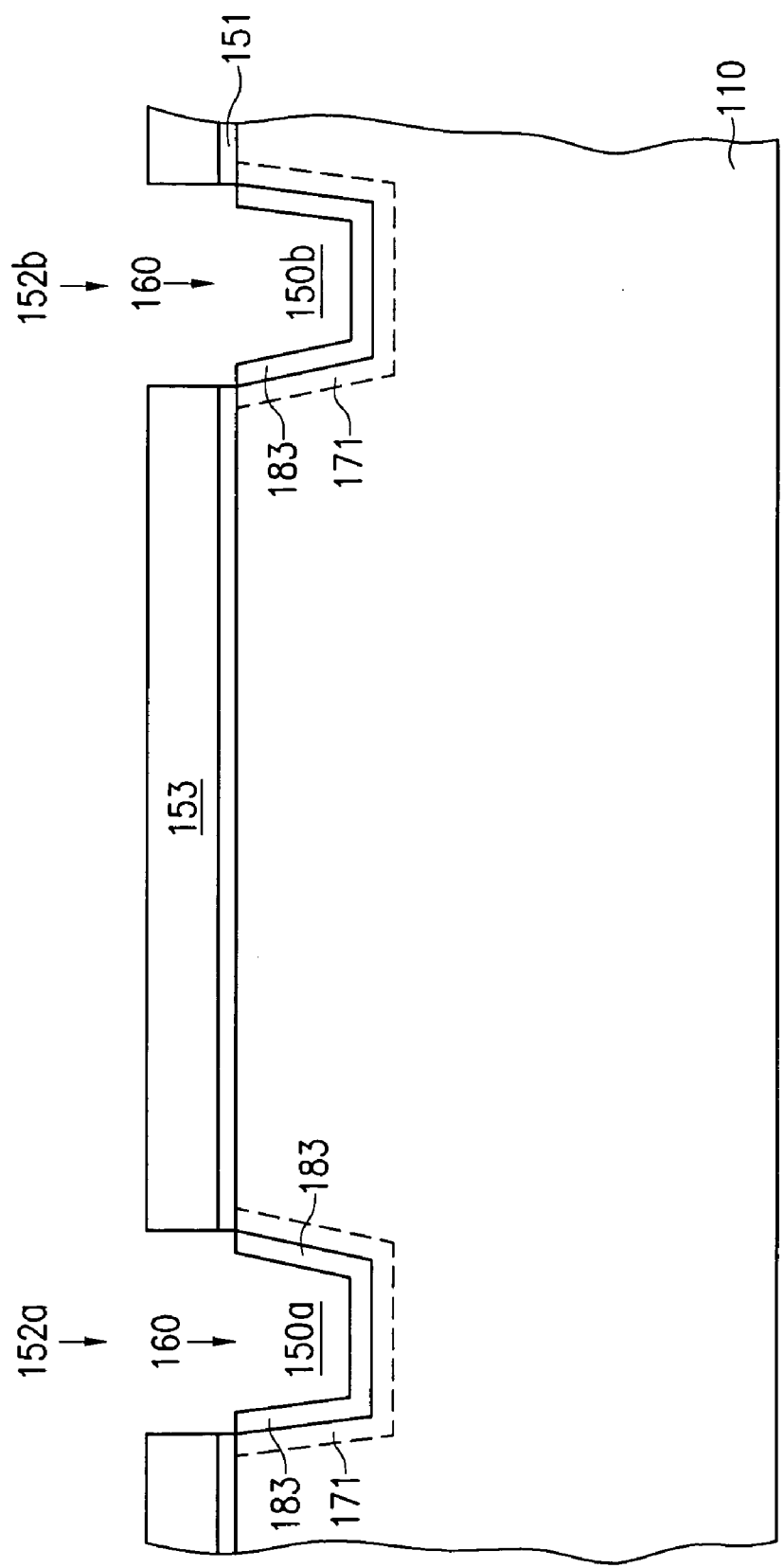

Referring now to FIG. 6H, dopant implantations or p-type isolation implants 160 are conducted to implant p-type ions, such as boron, beryllium, indium or magnesium, among others. The dopant implantations 160 may be conducted by placing the substrate 110 in an ion implanter and implanting appropriate p-type dopant ions through openings 152a, 152b into the substrate 110 to form p-type implanted regions 171. However, other methods well-known in the art can be used with equal utility.

P-type implant regions 171 are formed by an implant dose of from approximately $3.0\times10^{11}$ atoms/cm$^2$ to approximately $3.0\times10^{13}$ atoms/cm$^2$, and preferably from approximately $5.0\times10^{11}$ atoms/cm$^2$ to approximately $6.0\times10^{12}$ atoms/cm$^2$. The implant dose to form p-type implant regions 171 is conducted with an implant energy in the range of from approximately 2 keV to approximately 50 keV, and preferably from approximately 5 keV to approximately 20 keV.

Figure 6I:
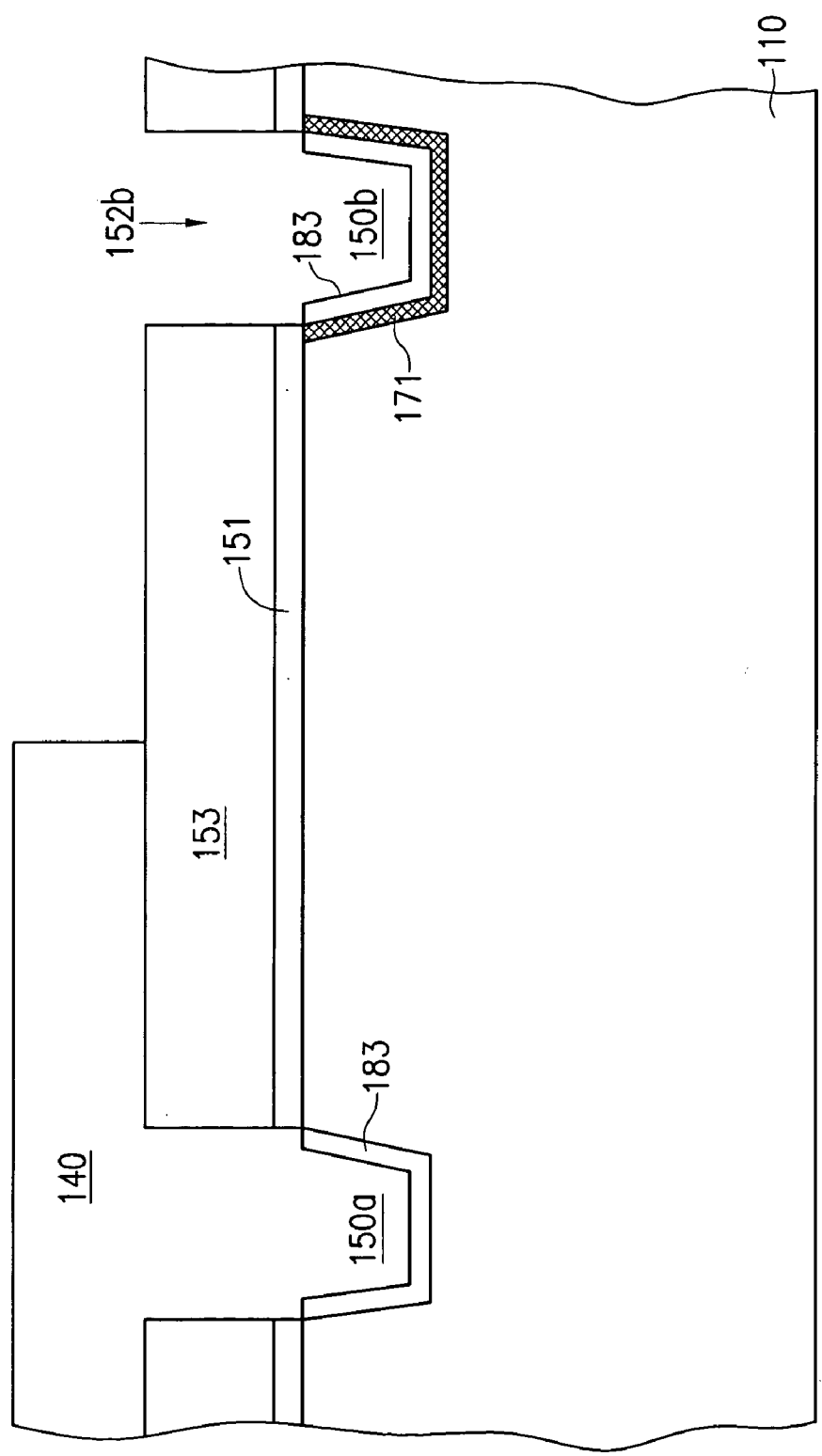
Figure 6J:
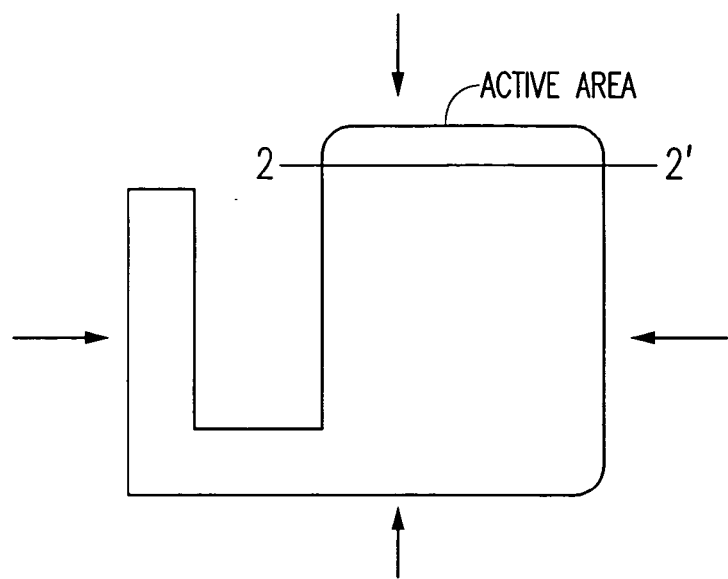

Referring now to FIG. 6I illustrating another embodiment for forming a trench isolation region 150b surrounded by p-type dopants, a masked p-type field implant can be implanted into the substrate 110 in a future p-well region (not illustrated). For instance, in FIG. 6I, a resist mask layer 140 can be provided over isolation region 150a for a masked p-type field implant below isolation region 150b. P-type dopant ions are implanted through the opening 152b to form the p-type region 171. The p-type implant to form the p-type region 171 can be conducted with methods well-known in the art. The p-type implant dose is from approximately $3.0\times10^{11}$ atoms/cm$^2$ to approximately $3.0\times10^{13}$ atoms/cm$^2$ and preferably from approximately $5.0\times10^{11}$ atoms/cm$^2$ to approximately $6.0\times10^{13}$ atoms/cm$^2$. For example, the p-type implant can be a four-way or orthogonal implant as FIG. 6J illustrates.

Figure 6K:
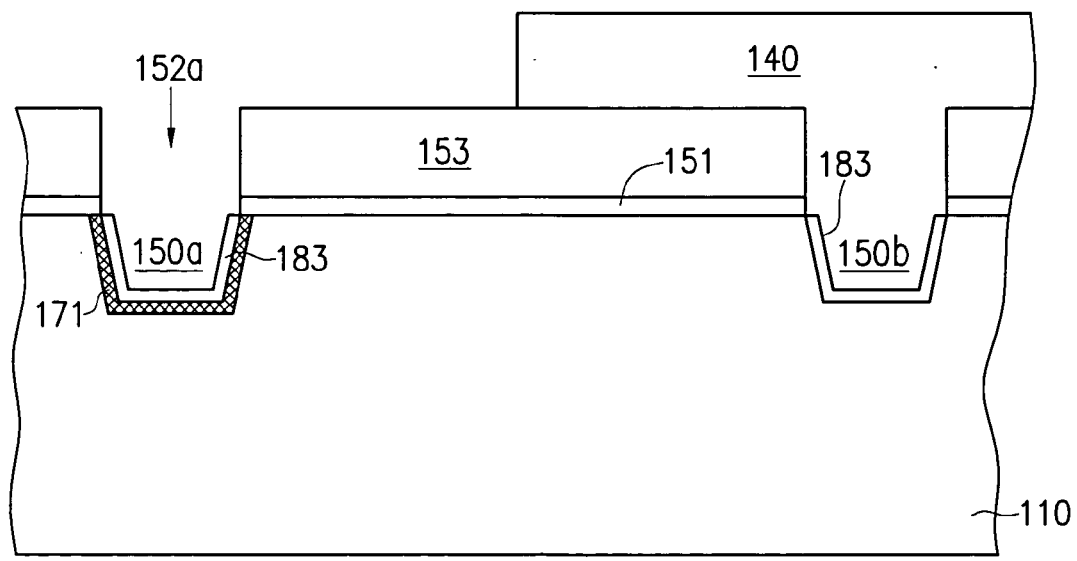

Referring now to FIG. 6K illustrating another embodiment, a masked n-type field implant can be implanted into the substrate 110 in a future n-well region. For instance, in FIG. 6K, a resist mask layer 140 can be provided over isolation region 150b for a masked n-type field implant below isolation region 150a. N-type dopant ions are implanted through the opening 152a to form the n-type region 171. The n-type implant to form the n-type region 171 can be conducted with methods well-known in the art. For example, the n-type implant can be a four-way or orthogonal implant as FIG. 6J illustrates. Any n-type dopant ion can be used such as phosphorous, arsenic, and antimony, among others to form n-type field implants, if desired.

It should be appreciated that a masked p-type field implant (FIG. 6I) and a masked n-type field implant (FIG. 6K) can both be employed, if desired. For instance, trench isolation region 150b can be formed with p-type dopant ions surrounding it and trench isolation region 150a can be formed with n-type dopant ions surrounding it, if desired.

Figure 6L:
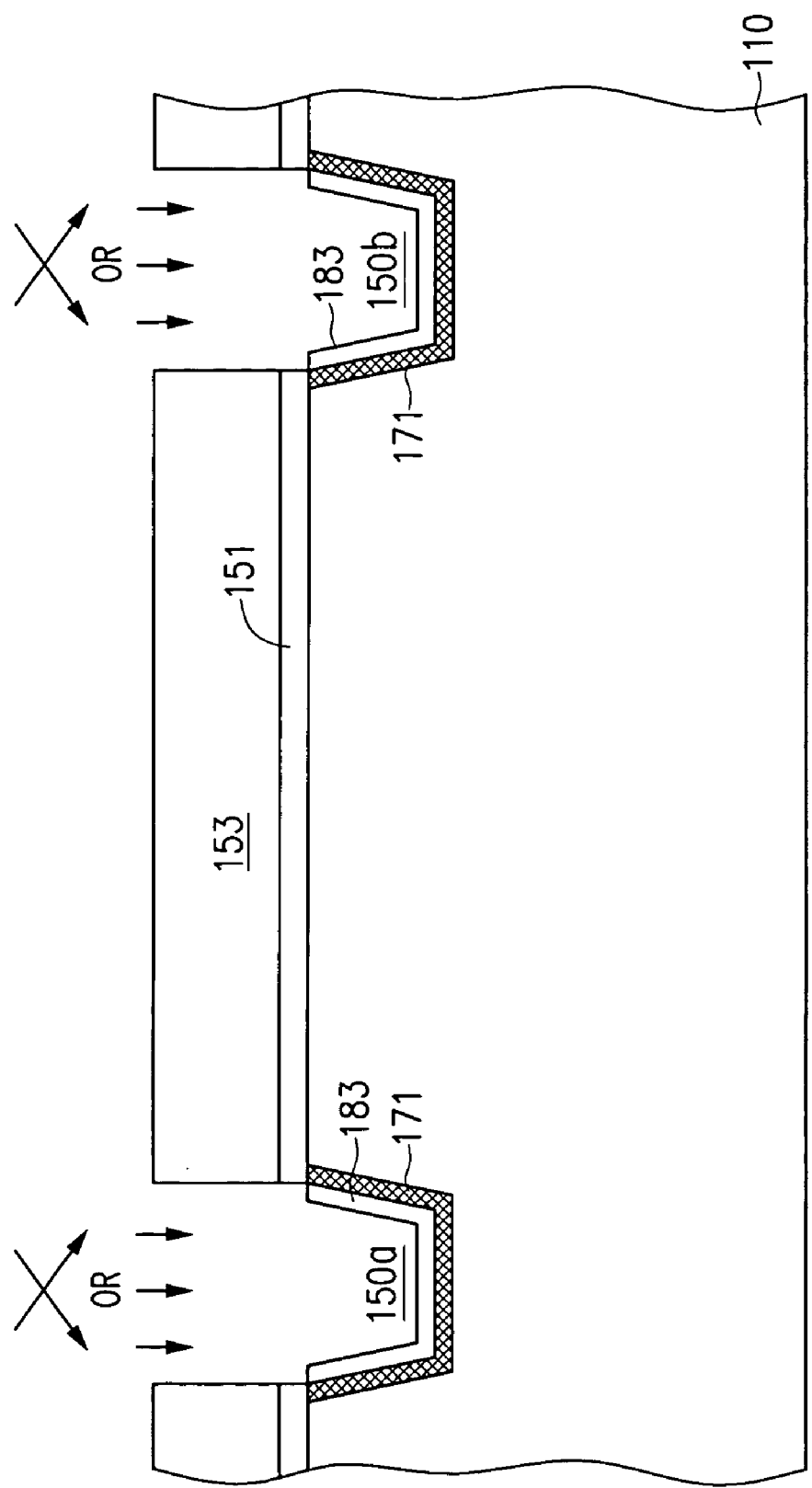

In yet another exemplary embodiment, blanket field implants, either p-type or n-type field implants can be conducted into the substrate 110. In FIG. 6L, no masks are provided over isolation regions 150a and 150b. The blanket p-type field implants can be conducted with methods well-known in the art to form p-type regions 171. Blanket n-type field implants can be conducted with methods well-known in the art to form n-type regions 171. For purposes of a simplified description, FIGS. 6K–9 are described as forming p-type regions 171.

The p-type implant dose is from approximately $3.0\times10^{11}$ atoms/cm$^2$ to approximately $3.0\times10^{13}$ atoms/cm$^2$, and preferably from approximately $5.0\times10^{11}$ atoms/cm$^2$ to approximately $6.0\times10^{13}$ atoms/cm$^2$. The blanket field implants can be a four-way or orthogonal implant as illustrated in FIG. 6J.

When the blanket field implant is a p-type implant, the advantage is that the p-well field is improved without the addition of a mask. A disadvantage is that the p-well field implant is restricted in dose because the n-well field is degraded. The contrary holds true when using a blanket field implant to form n-wells. The n-well field is improved without the addition of a mask. A disadvantage is that the n-well field implant is restricted in dose because the p-well field is degraded. One advantage of using a mask layer 140, as FIGS. 6I and 6K utilize, is that masking allows the field implant dose to increase and there is no degradation on the opposite field type as associated when employing a blanket field implant.

Figure 6M:
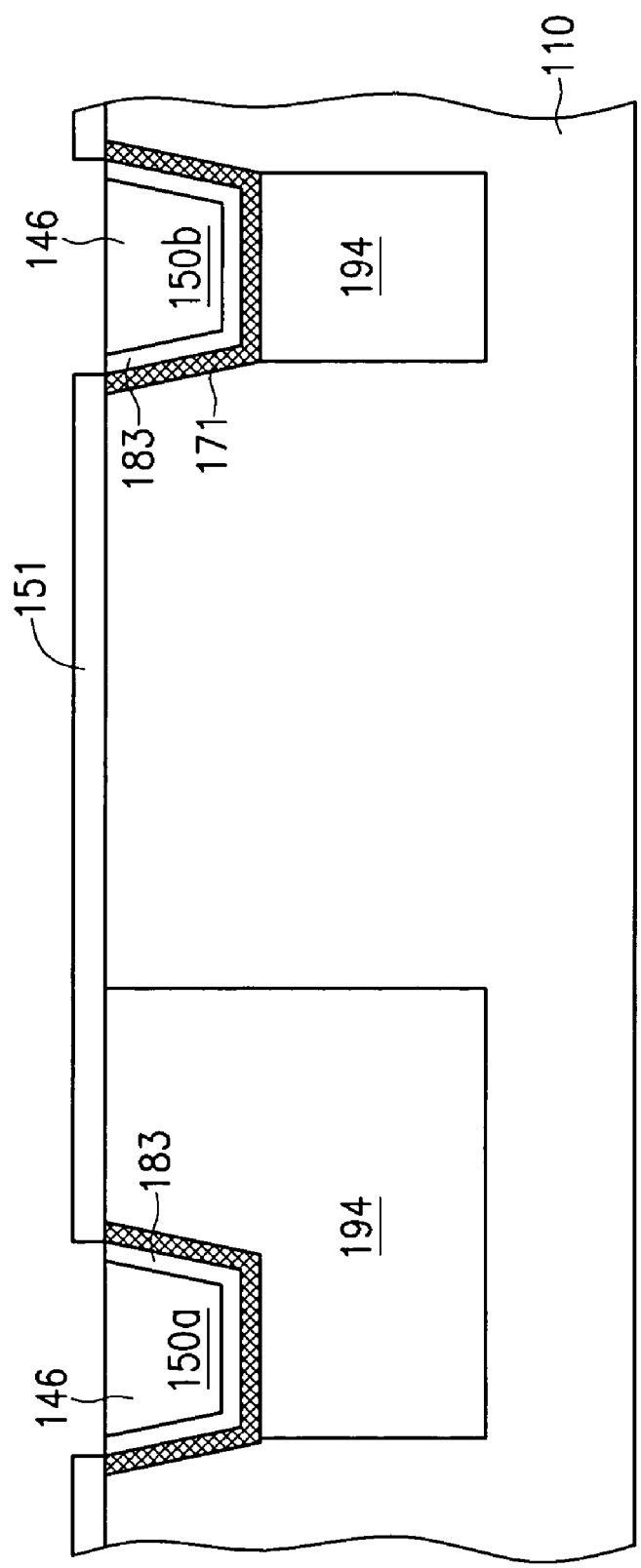
Figure 7:
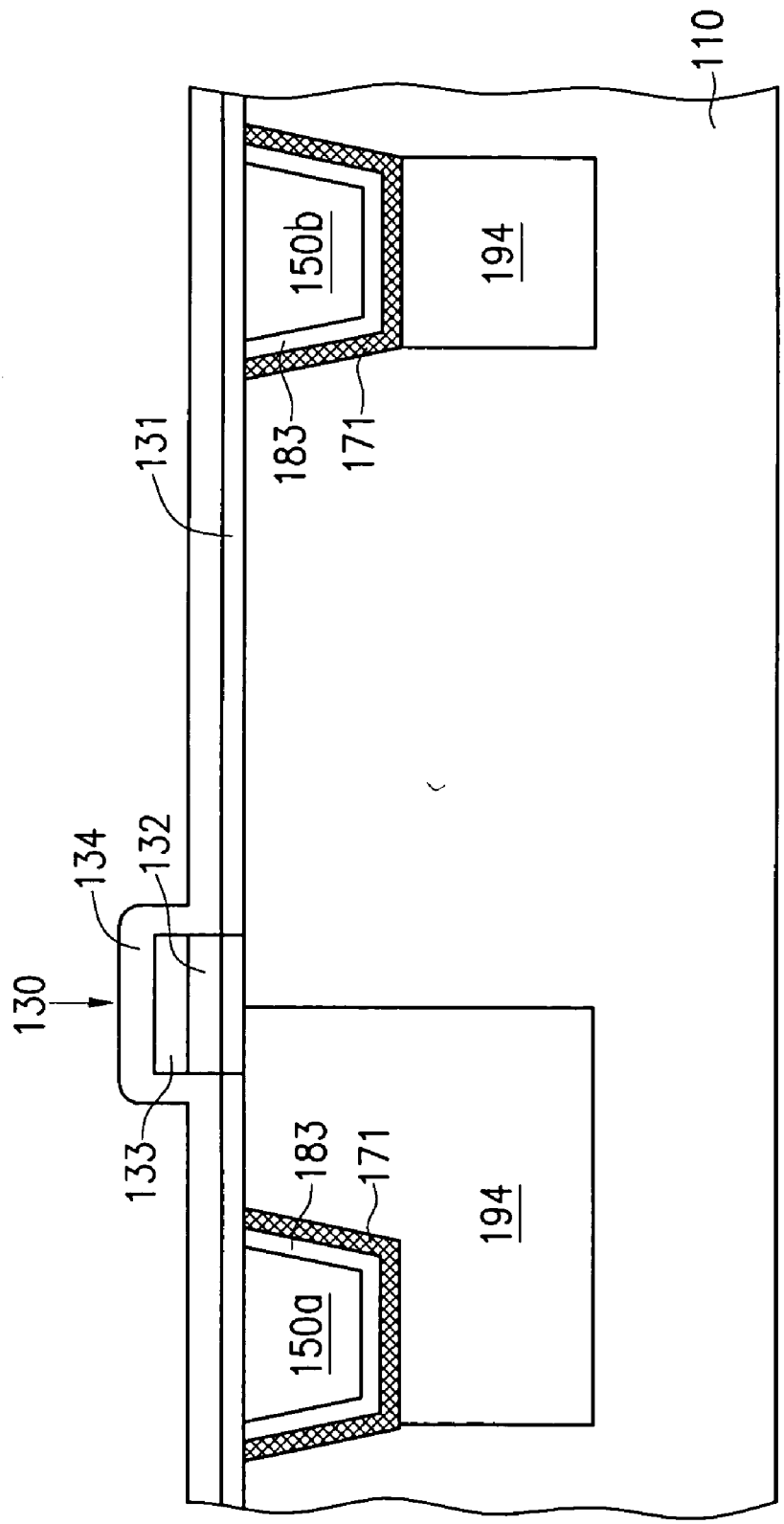
FIG. 7 is a schematic cross-sectional views of the CMOS image pixel cell of FIG. 5A at a stage of processing subsequent to that shown in FIGS. 6A–6E.

For purposes of a simplified description, FIGS. 6M–9 are described below with the formation of p-wells 194 below isolation regions 150a, 150b. However, it should be appreciated that the p-wells 194 can be implanted at a later or earlier point in the processing sequences depicted in FIGS. 6A–9. For instance, in another exemplary embodiment, p-wells 194 can be implanted after the transistor gate stack of FIG. 7 is etched.

Referring now to FIG. 6M, an insulator 146 is deposited such as HDP oxide so that trench isolation regions 150a and 150b are completely filled. The wafer is then planarized with known techniques such as CMP, or by dry etch techniques such as resist etch-back to create a planar surface for isolation regions 150a and 150b.

Still referring to FIG. 6M, the hard mask layer 153 is then removed by conventional techniques, such as wet or dry etching, to complete the formation of trench isolation regions 150a and 150b. Trench isolation region 150b is depicted as comprising a p-type implanted region 171 surrounding the isolation region 150b and trench isolation region 150a is depicted as comprising a p-type implanted region 171 surrounding the isolation region 150a. However, although not illustrated, a p-type implanted region 171 can be provided only around trench isolation region 150a or 150b, if desired. Further, FIG. 6M illustrates p-well regions 194 below trench isolation regions 150a, 150b. It should be appreciated that presence of p-well regions 194 is optional. However, if p-well regions 194 are present, they should be formed with an implant dose of from about $5.0 \times 10^{11}$ to about $5.0 \times 10^{13}/cm^2$, and preferably from about $1.0 \times 10^{12}$ to about $1.0 \times 10^{13}/cm^2$.

Referring now to FIG. 7, a multi-layered transfer transistor gate stack 130 is formed over the semiconductor substrate 110. The oxide layer 151 can be removed by techniques well known in the art, such as a wet etch. The first gate oxide layer 131 can then be grown or deposited by conventional methods or techniques. A conductive layer 132 of doped polysilicon or other suitable conductor material and a second insulating layer 133, which may be formed of, for example, silicon oxide (silicon dioxide), nitride (silicon nitride), oxynitride (silicon oxynitride), ON (oxide-nitride), NO (nitride-oxide), ONO (oxide-nitride-oxide), or other suitable materials are deposited over the gate insulator 131. The first and second insulating layers 131, 133 and the conductive layer 132 may be formed by conventional deposition methods, for example, chemical vapor deposition (CVD) or plasma enhanced chemical vapor deposition (PECVD), among many others.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, tantalum silicide, among many others. The silicide layer could also be a barrier layer/refractory metal such as TiN/W or WNx/W or it could be entirely formed of WNx.

FIG. 7 also illustrates insulating oxide layer 134 which can be deposited or grown over the substrate 110. The insulating oxide layer 134 can be formed, for example, of silicon dioxide, silicon nitride, silicon oxynitride, ON, NO, ONO or TEOS, among others. The insulating oxide layer 134 can be subsequently etched to form sidewall spacers, if desired.

If desired, the substrate 110 can be doped with p-type dopants. The substrate 110 can be formed to have a doping concentration of from approximately $1.0 \times 10^{14}$ atoms/cm$^3$ to approximately $1.0 \times 10^{16}$ atoms/cm$^3$, and preferably of from approximately $5.0 \times 10^{14}$ atoms/cm$^3$ to approximately $3.0 \times 10^{15}$ atoms/cm$^3$. Although FIG. 7 illustrates doping the substrate 110 after the gate stack 130 is formed, this is not a requirement. The substrate 110 can be doped before the gate stack 130 is etched. For instance, the substrate 110 can be doped during formation of p-wells 194. Further, the substrate 110 can be formed by also using epi wafers.

Figure 8:
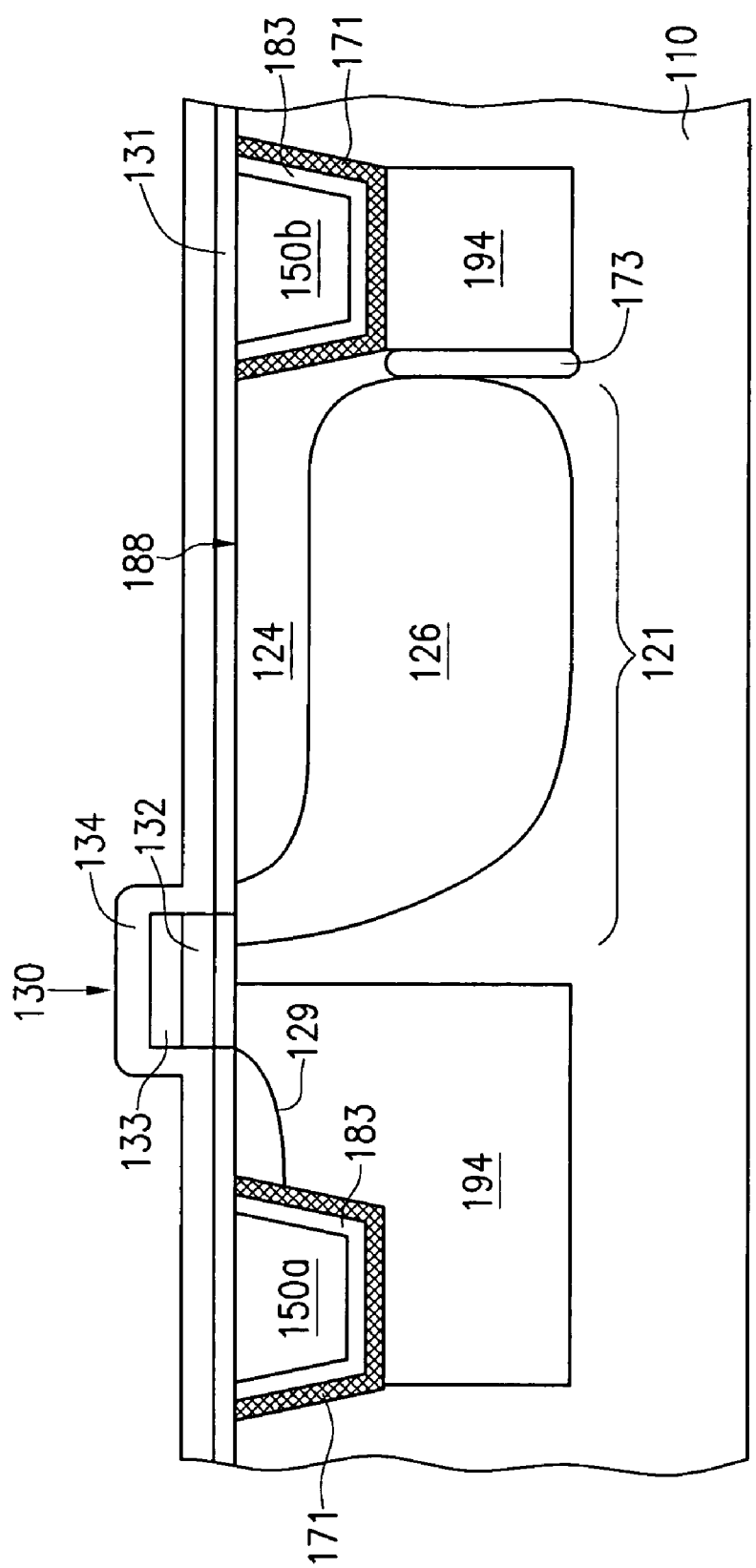
FIG. 8 is a schematic cross-sectional views of the CMOS image pixel cell of FIG. 5A at a stage of processing subsequent to that shown in FIG. 7.

Next, FIG. 8 illustrates the formation of a p-n-p photodiode 188 with regions 124, 110 and 126.

The p-type doped region 110 is formed with a dopant ion of a first conductivity type, which for exemplary purposes is p-type. The p-type doped region 110 has a doping concentration of from approximately $1.0 \times 10^{14}$ atoms/cm$^3$ to approximately $1.0 \times 10^{16}$ atoms/cm$^3$, and preferably of from approximately $5.0 \times 10^{14}$ atoms/cm$^3$ to approximately $3.0 \times 10^{15}$ atoms/cm$^3$.

The n-type region 126 is formed by implanting dopant ions of a second conductivity type, which for exemplary purposes is n-type, in the area of the substrate 110 directly beneath the active area 128 of the pixel cell 100 (FIG. 5A).

The implanted n-doped region 126 forms a photosensitive charge collection region 121 for collecting photogenerated electrons. N-type dopant ions such as arsenic, antimony, or phosphorus, among others, may be employed. Since the p-type region 171 surrounding the trench isolation region 150b is present, the n-type region 126 can be formed closer to trench isolation region 150b.

Further, the n-doped region 126 can be formed using one or multiple implants to grade the implant profile of the charge collection region 121, e.g., creating a doping gradient. For instance, the n-doped region 126 can have a higher concentration of n-type dopants near the p-type pinned surface layer 124 interface than at the p-type doped region 110 interface. Conversely, the n-doped region 126 can have a lower concentration of n-type dopants near the p-type pinned surface layer 124 interface than at the p-type doped region 110 interface. The n-doped region 126 can also have a uniform dopant concentration such that no doping gradient exists.

The n-type region 126 is formed to be at least approximately less than $0.30\mu$ away from trench isolation region 150b, and preferably from approximately $0.15\mu$ to $0.00\mu$ away. In the prior art, as FIGS. 3A–3B illustrate, the pinned photodiode 11 (FIGS. 3A–3B) was formed to be at least $0.30\mu$ away from the trench isolation region 15 (FIG. 3B). Accordingly, the enclosed shallow trench region 150b (comprising region 171) can now be used as a self-aligned mask in forming region 126. The n-type region 126 is formed with an implant dose that is from approximately $1.0 \times 10^{12}$ atoms/cm$^2$ to approximately $1.0 \times 10^{14}$ atoms/cm$^2$, and preferably from approximately $2.0 \times 10^{12}$ atoms/cm$^2$ to approximately $1.0 \times 10^{13}$ atoms/cm$^2$.

Next, the p-type pinned surface layer 124 is formed by conducting a dopant implantation with a dopant ion of a first conductivity type, which for exemplary purposes is p-type, so that p-type ions are implanted into the active area 128 of the substrate 110 over the implanted n-type region 126 and between the transfer gate 130 and enclosed shallow trench isolation region 150b. Accordingly, the p-type pinned surface layer 124 is linked via region 171 to p-well 194. Region 171 provides good substrate to surface connection. Specifically, region 171 electrically connects the p-type pinned surface layer 124 with the p-type region 110 or p-well 194.

The implant dose of the p-type pinned surface layer 124 is from approximately $3.0 \times 10^{12}$ atoms/cm$^2$ to approximately $1.0 \times 10^{14}$ atoms/cm$^2$, and preferably from about $5.0 \times 10^{12}$ atoms/cm$^2$ to approximately $4.0 \times 10^{13}$ atoms/cm$^2$.

The pinned photodiode 188 structure, comprising regions 124, 126, and 1210, can be formed self-aligning to the isolation region 150b surrounded by region 171 and transfer transistor structure 130 as a result of the presence of p-type region 171. Region 171 can act as a self-aligned mask in forming region 126. Further, the presence of the p-type region 171 allows the photodiode's 188 charge collection region 126 to be formed closer to region 150b and thus to a greater size, if desired.

A larger charge collection region 126 enhances the capacitance of the photodiode 188. In addition, the p-type region 171 does not require that the photodiode 188 structure be laterally displaced from the photodiode's active area. Moreover, the photodiode 188 structure can overlap the photodiode's active area, e.g., extend to and partially beneath isolation region 150b, without increasing the dark current in a pixel cell.

Figure 9:
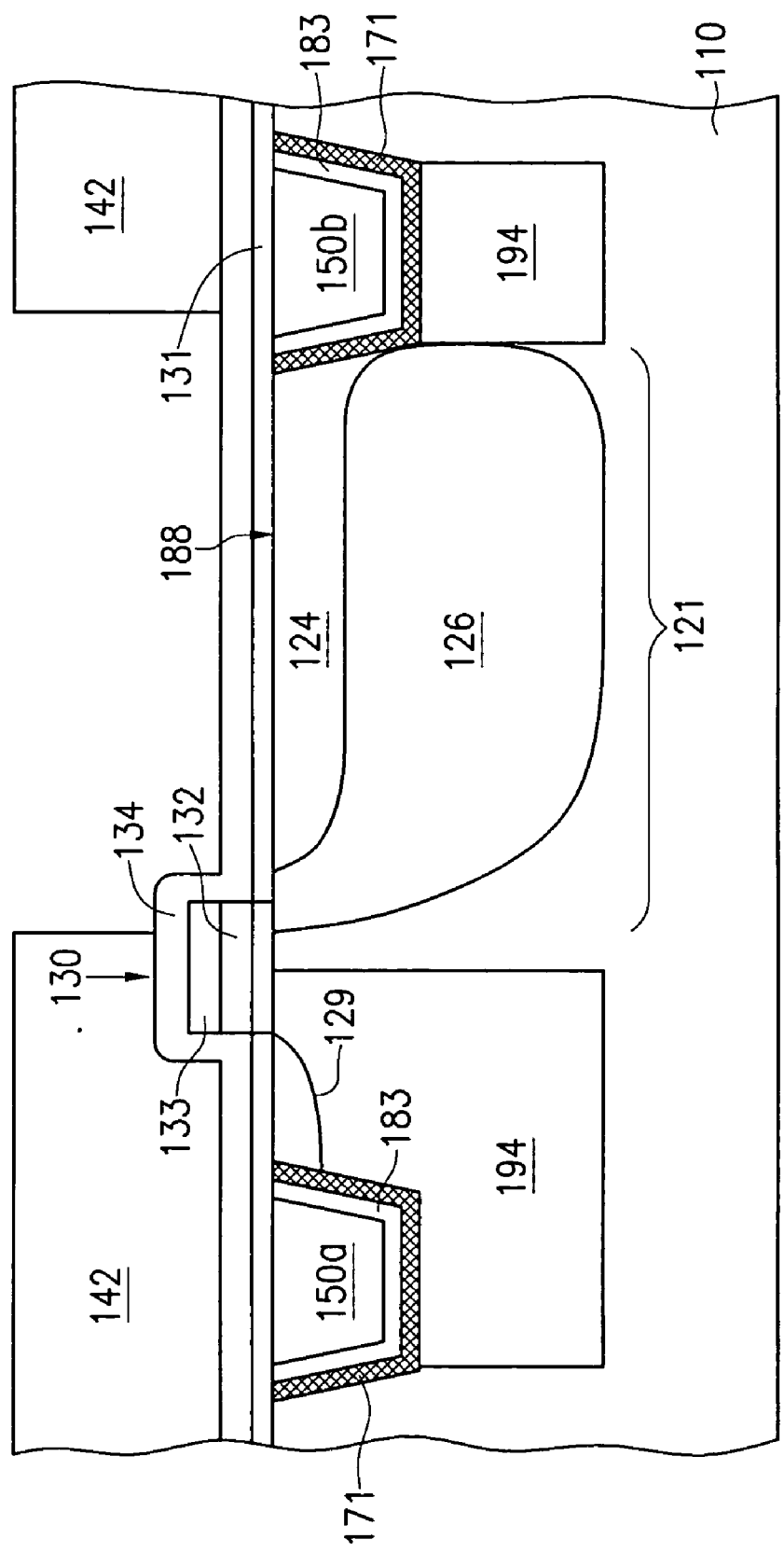
FIG. 9 is a schematic cross-sectional views of the CMOS image pixel cell of FIG. 5A during an implant processing step in which n-type dopant ions are used to form the charge collection region of a photodiode constructed in accordance with one exemplary embodiment of the present invention.

Referring now to FIG. 9, the p-type implanted region 171 allows a photoresist or mask 142 used to form the n-type region 126 to be moved closer to the trench isolation region

150b than previously done. The n-type region 126 can now be implanted to be approximately 0.30µ or less, away from the enclosed shallow trench region 150b. As discussed above, a larger n-type implant region 126 results in a larger charge collection region 121 (FIG. 5A), higher capacitance, and no increase in dark current for pixel cell 100 (FIG. 5A). After thermal processing, the n-type region 126 diffuses outwards so that it can physically come into contact with p-type region 171 and the p-well implant region 194. In this manner, the n-type region 126 is formed self-aligned to region 171 and p-well 194.

It should be appreciated that the invention further contemplates moving the edges of the n-type implant region 126 over the shallow trench isolation region 150b, if desired. However, for purposes of a simplified description, FIG. 9 depicts the n-type implant region 126 as only physically coming into contact with region 171 and p-well 194.

The remaining structures of the pixel cell 100, including floating diffusion region 129, reset transistor, source follower transistor and row select transistor, shown in the 4T pixel cell of FIG. 5A as associated with respective gates 40, 50 and 60, are also formed by well-known methods to obtain an operative pixel.

For instance, conventional processing steps may be employed to form contacts and wiring to connect gate lines and other connections in the pixel cell 100. The entire surface may be covered with a passivation layer of, e.g., silicon dioxide, BSG, PSG, or BPSG, which can be CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel cell and to connect the pixel cell to logic circuits on the periphery of a pixel array.

The enclosed shallow trench region 150b of FIG. 5B can act also as a barrier to electrons generated by light in the n-doped region 126 of the p-n-p photodiode 188 structure. When light radiation in the form of photons strikes the p-n junction, formed by regions 124 and 126, electrons are formed and collected in n-doped region 126. For the case of a p-doped charge collection region 126 provided in an n-type substrate 110, it is the holes that are stored. Thus, in the exemplary embodiment described above having n-channel devices formed in the p-type region 110, the carriers stored in the n-doped charge collection region 126 are electrons.

The shallow trench isolation regions 150a and 150b surrounded by dopants of a first conductivity also acts to reduce cross-talk, e.g., charge transmission, between adjacent pixel sensor cells by providing a good leakage electrical connection from the p-type pinned surface layer 124 to the p-type substrate region 110 via linking region 173. Further, leakage charges from the charge collection region 126 can be reflected back from the enclosed isolation regions 150a and 150b to the charge collection region 126.

In addition to the benefits provided above, the enclosed shallow trench isolation regions 150a and 150b provide good photodiode-to-photodiode isolation, for example, isolation of the p-n-p photodiode 188 structure from an adjacent photodiode (not shown) located on the other side of the enclosed shallow trench isolation regions 150a and 150b.

Further, the enclosed shallow trench isolation regions 150a and 150b also reduce the formation of trap sites along the bottom 181 and sidewalls 182 of the shallow trench isolation regions 150a and 150b, which become charged when electrons and holes become trapped in the trap sites and consequently affect the threshold voltage of the photodiode 188 structure. A reduction in the formation of these trap sites along the bottom 181 and sidewalls 182 of the trench isolation regions 150a and 150b, results in a reduction of dark current generation and leakage near and along the trench bottoms 181.

Although the above embodiments have been described with reference to the formation of a p-n-p photodiode, such as the p-n-p photodiode 188 (FIG. 5B) having a n-type charge collection region 126 formed adjacent respective pinned layer 124, it must be understood that the invention is not limited to this embodiment.

Accordingly, the invention has equal applicability to n-p-n photodiodes comprising a p-type charge collection region formed in a n-type region. The shallow trench isolation regions 150a and 150b, in this embodiment, would be enclosed or surrounded by n-type dopant ions rather than p-type dopant ions as illustrated in FIG. 5B. Further, the dopant and conductivity type of all structures would change accordingly, with the transfer gate 130 corresponding to a PMOS transistor.

It should also be appreciated although the implant doses are provided in atoms/cm$^2$, the dopant concentration can be roughly calculated by multiplying the implant dose by a factor of $1.0 \times 10^4$ to achieve a dopant concentration in atoms/cm$^3$. It should also be appreciated that the function of the energy of the implant, the depth of diffusion, and the implant profile also will affect the dopant concentration.

Figure 10:
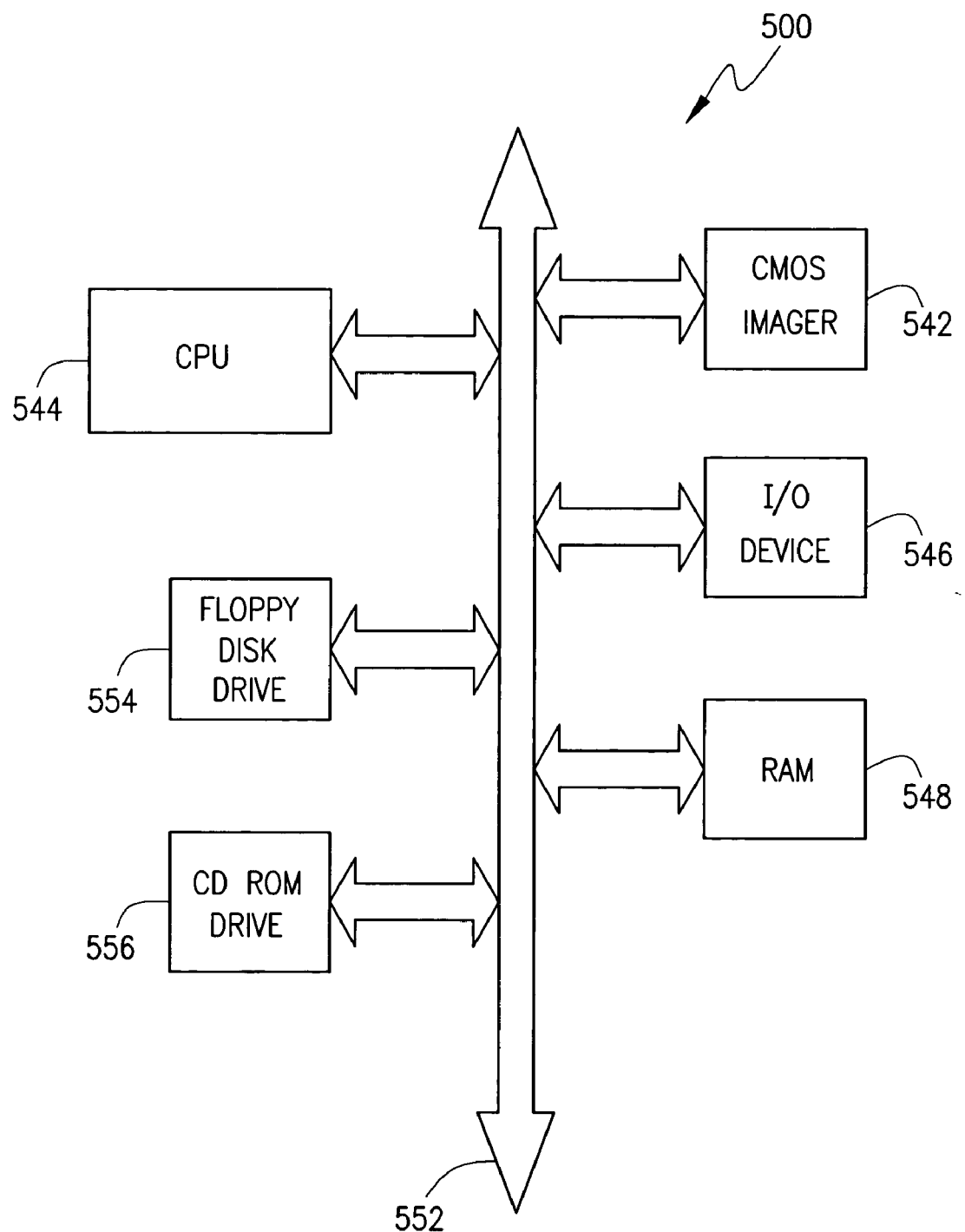
FIG. 10 illustrates a CMOS imager containing a CMOS image pixel cell constructed in accordance with the present invention with a processing system.
Figure 1:
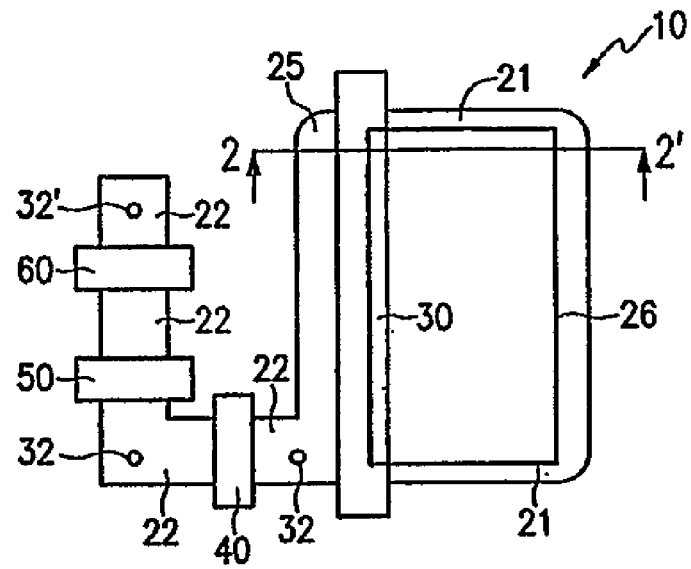
Figure 2:
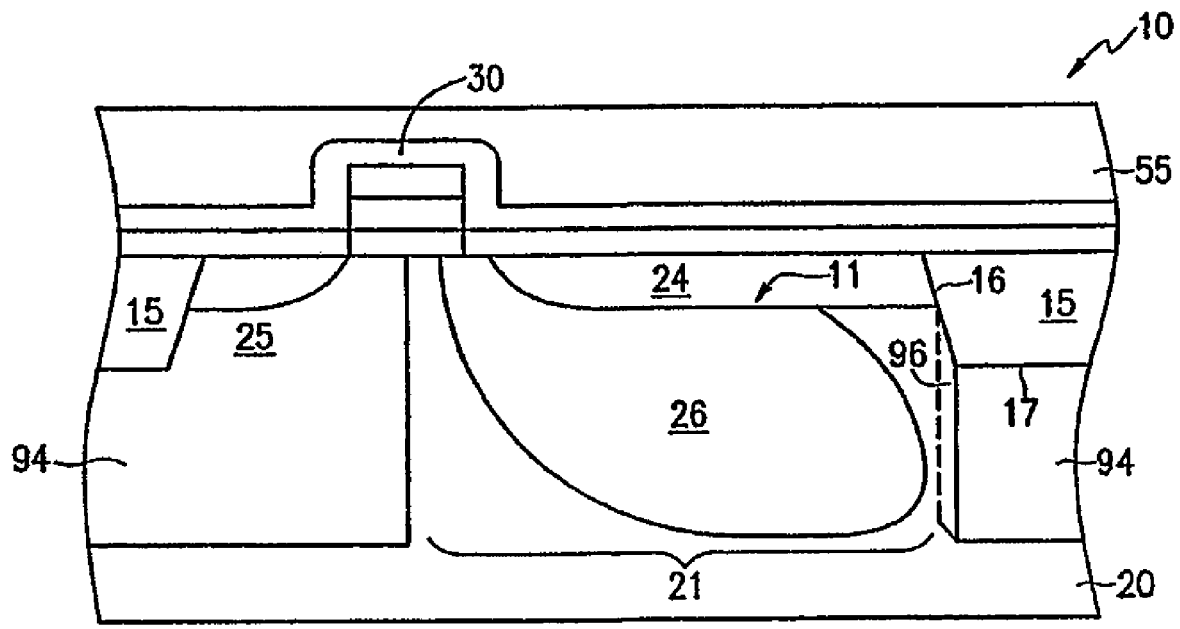
Figure 3A:
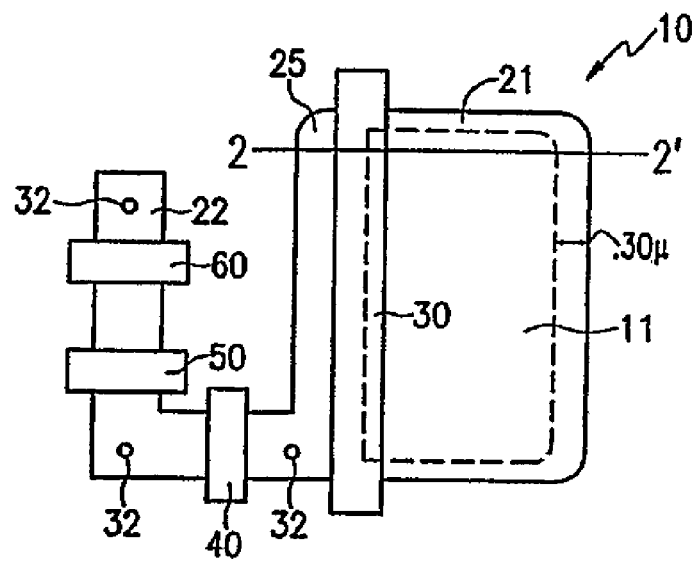
Figure 3B:
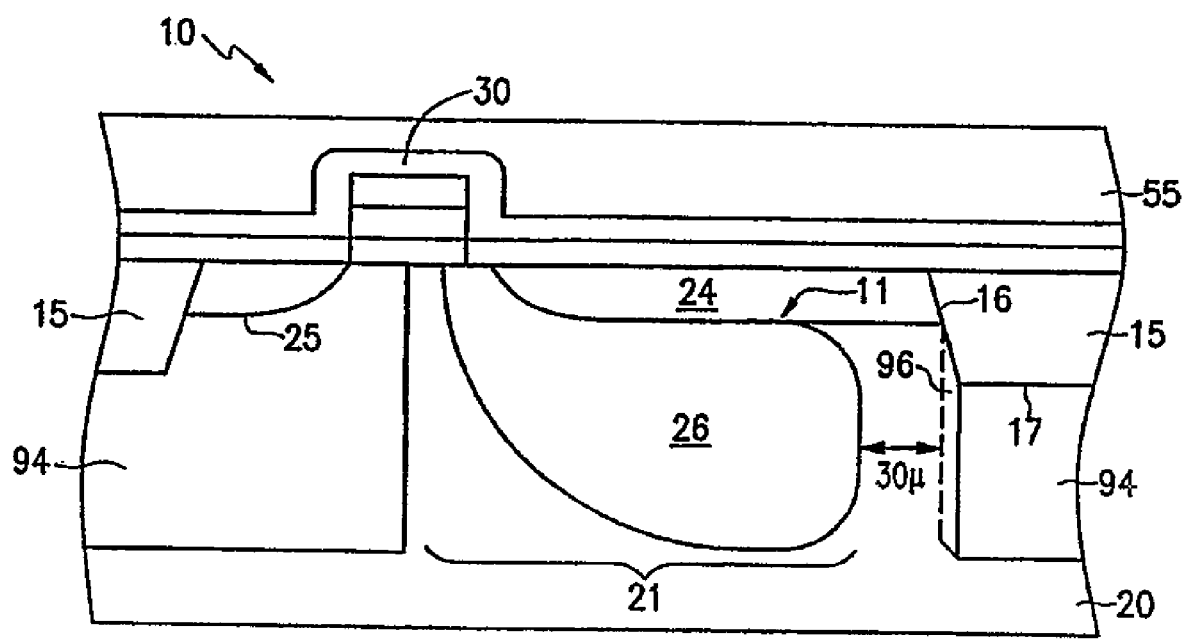
Figure 4A:
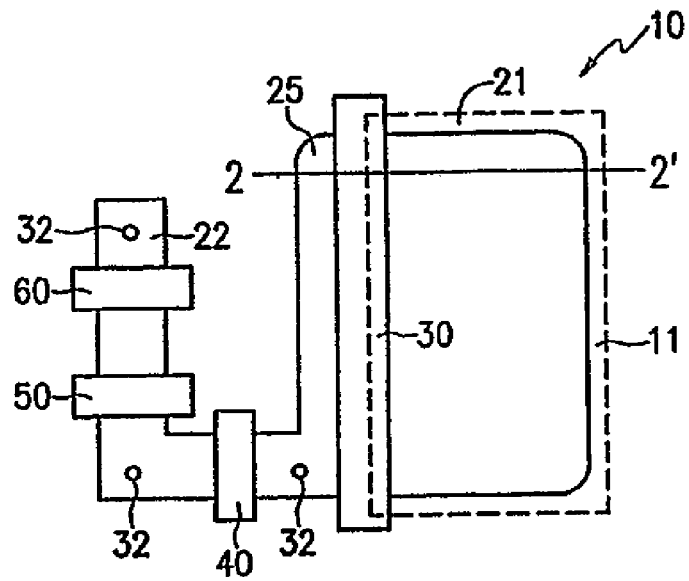
Figure 4B:
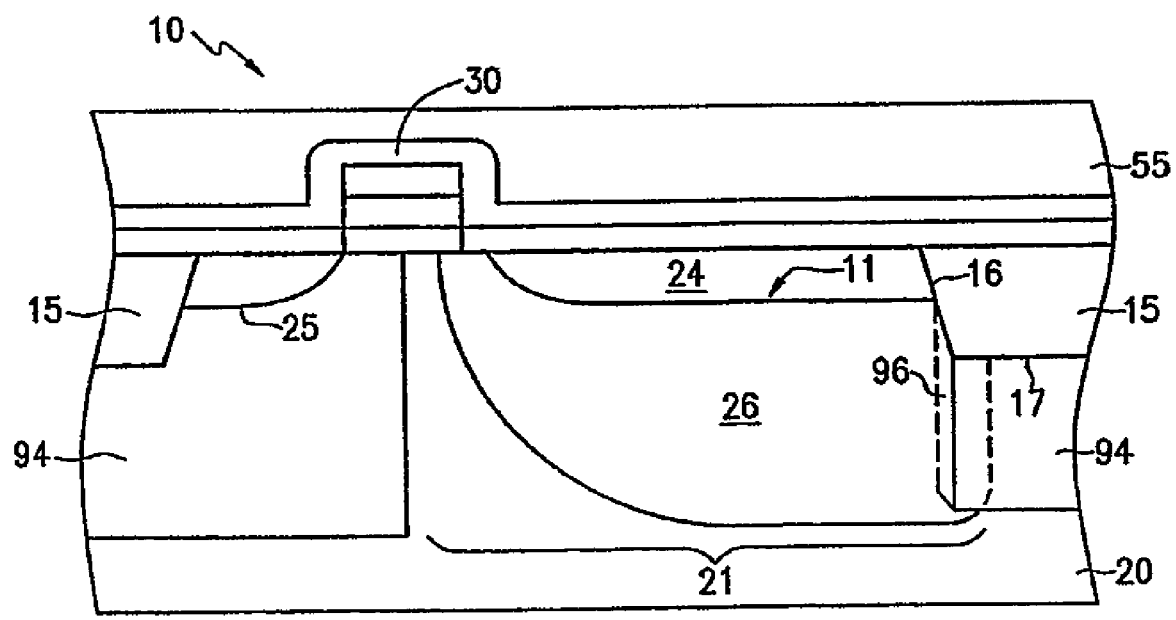
Figure 5A:
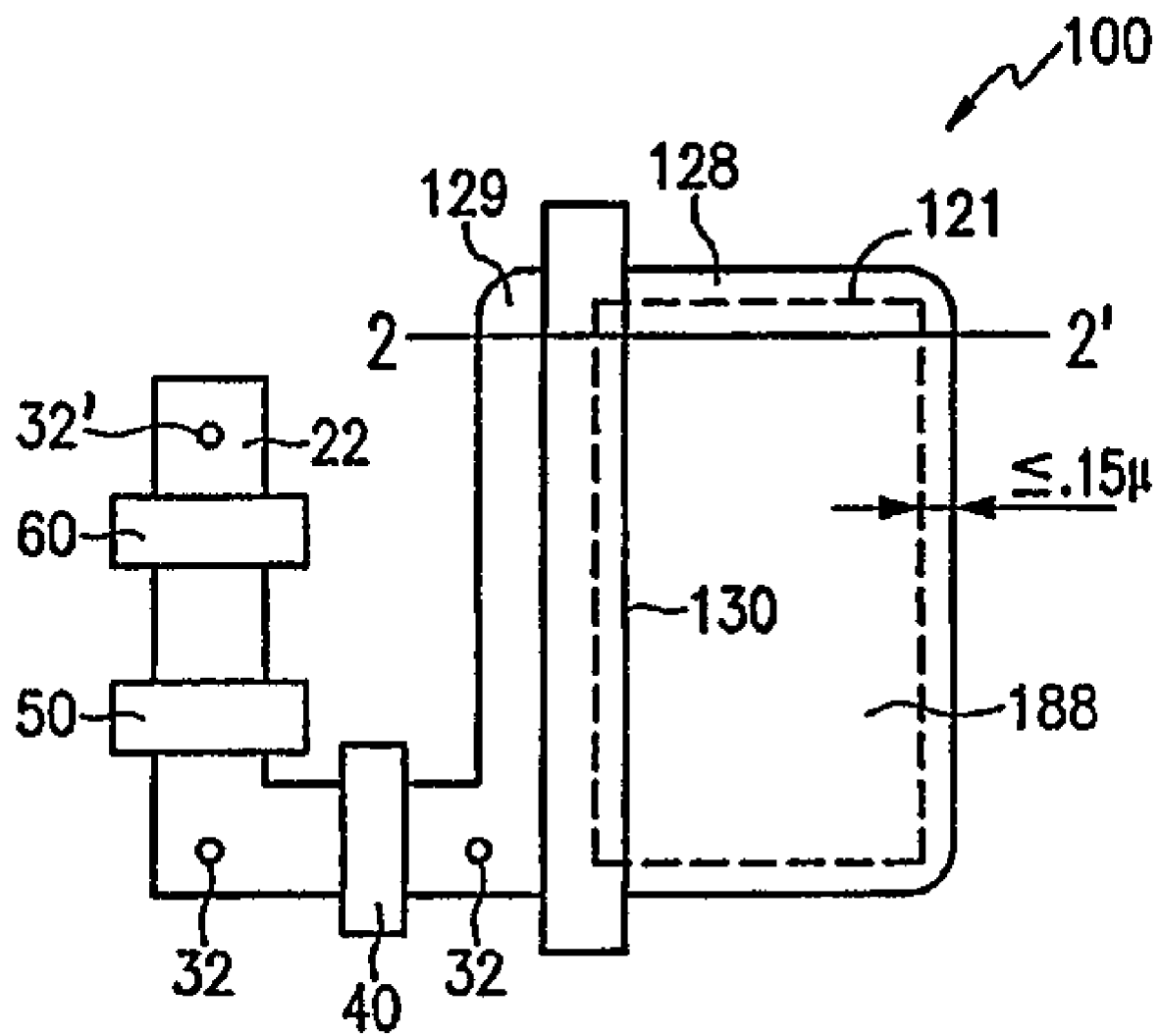

A typical processor based system which includes a CMOS imager device 542 having a pixel array in which the pixels are constructed according to the present invention is illustrated generally at 500 in FIG. 10. The imager device produces an output image signal from signals supplied from the pixel array. A processor based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager device 542 also communicates with the system over bus 552 or other communication link. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. It may also be desirable to integrate the processor 554, CMOS imager device 542 and memory 548 on a single IC chip.

The invention has been described with reference to pixels employing n-channel transistors. However, it should be understood that the invention is not so limited and may be employed in pixels have p-channel devices formed within a n-type substrate.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. An image device comprising:
   at least one isolation trench provided in a substrate having a first conductivity type, said substrate having a first dopant concentration;
   a doped region having said first conductivity type surrounding at least a portion of said trench in said substrate, said doped region having a second dopant concentration; and
   a photosensitive region formed less than 0.30μ away from the at least one isolation trench and the doped region.

2. An image device as in claim 1, wherein said trench comprises a dielectric material.

3. An image device as in claim 2, wherein said dielectric material is selected from at least one of SiO, $SiO_2$, oxynitride, silicon nitride, and silicon carbide.

4. An image device as in claim 2, wherein said dielectric material is a high density plasma oxide.

5. An image device as in claim 1, wherein said trench is a shallow trench isolation region.

6. An image device as in claim 1, wherein said first conductivity is a p-type conductivity.

7. An image device as in claim 6, wherein said doped region has an implant dose of from approximately $3.0\times10^{11}$ atoms/cm$^2$ to approximately $3.0\times10^{13}$ atoms/cm$^2$.

8. An image device as in claim 7, wherein said doped region has an implant dose of from approximately $5.0\times10^{11}$ atoms/cm$^2$ to approximately $6.0\times10^{12}$ atoms/cm$^2$.

9. An image device as in claim 1, wherein said photosensitive region is a photodiode formed adjacent to said doped region and trench, said photodiode having a p-type region and an n-type region.

10. An image device as in claim 9, wherein said p-type region has an implant dose of from approximately $3.0\times10^{12}$ atoms/cm$^2$ to approximately $1.0\times10^{14}$ atoms/cm$^2$.

11. An image device as in claim 10, wherein said p-type region has an implant dose of from approximately $5.0\times10^{12}$ atoms/cm$^2$ to approximately $4.0\times10^{13}$ atoms/cm$^2$.

12. An image device as in claim 9, wherein said n-type region is approximately 0.15μ to approximately 0.00μ away from said trench and doped region.

13. An image device as in claim 9, wherein said photodiode is a pnp photodiode.

14. An image device as in claim 1, wherein said substrate has a p-type implant concentration of from about $1.0\times10^{14}$ atoms/cm$^3$ to about $1.0\times10^{16}$ atoms/cm$^3$.

15. An image device as in claim 14, wherein said substrate has a p-type implant concentration of from about $5.0\times10^{14}$ atoms/cm$^3$ to about $3.0\times10^{15}$ atoms/cm$^3$.

16. An image device as in claim 1, further comprising a p-well region located beneath said trench and doped region, said p-well region having an implant dose of from about $5.0\times10^{11}$ atoms/cm$^2$ to about $5.0\times10^{13}$ atoms/cm$^2$.

17. An image device as in claim 16, wherein said p-well region has an implant dose of from about $1.0\times10^{12}$ atoms/cm$^2$ to approximately $1.0\times10^{13}$ atoms/cm$^2$.

18. An image device as in claim 1, wherein said image device is a CCD imager.

19. An image device as in claim 1, wherein said image device is a CMOS imager.

20. An image device as in claim 1, wherein said photosensor is one of a photoconductor or photogate.

21. An image structure comprising:
   a trench isolation region surrounded at least in part by a first doped region with a first conductivity type having a first impurity implant dose, wherein said first doped region is surrounded by a second doped region of said first conductivity type having a second impurity implant dose; and
   a charge collection region with a second conductivity type formed to be less than 0.30μ away from said trench isolation region.

22. A structure as in claim 21, wherein said first conductivity type is p-type conductivity.

23. A structure as in claim 21, wherein said first impurity dose implant concentration is in the range from approximately $3.0\times10^{11}$ atoms/cm$^2$ to approximately $3.0\times10^{13}$ atoms/cm$^2$.

24. A structure as in claim 23, wherein said first impurity dose implant concentration is in the range from approximately $5.0\times10^{11}$ atoms/cm$^2$ to approximately $6.0\times10^{12}$ atoms/cm$^2$.

25. A structure as in claim 21, wherein said second doped region is a p-well region.

26. A structure as in claim 25, wherein said second impurity implant dose is in the range from approximately $5.0\times10^{11}$ atoms/cm$^2$ to approximately $5.0\times10^{13}$ atoms/cm$^2$.

27. A structure as in claim 26, wherein said second impurity implant dose is in the range from approximately $1.0\times10^{12}$ atoms/cm$^2$ to approximately $1.0\times10^{13}$ atoms/cm$^2$.

28. A structure as in claim 21, wherein said second doped region is a p-type substrate region.

29. A structure as in claim 28, wherein said second impurity implant concentration is in the range from approximately $1.0\times10^{14}$ atoms/cm$^3$ to approximately $1.0\times10^{16}$ atoms/cm$^3$.

30. A structure as in claim 29, wherein said second impurity implant concentration is in the range from approximately $5.0\times10^{14}$ atoms/cm$^3$ to approximately $3.0\times10^{15}$ atoms/cm$^3$.

31. A structure as in claim 21, wherein said first doped region surrounds the sidewalls and bottom of said trench isolation region.

32. A structure as in claim 21, wherein said second conductivity is n-type conductivity.

33. A structure as in claim 21, wherein said charge collection region is formed to be approximately 0.15μ to approximately 0.00μ away from said trench isolation region.

34. A structure as in claim 21, further comprising a pinned surface layer with p-type conductivity formed over said charge collection region, said pinned surface layer is formed with an implant dose of from approximately $3.0\times10^{12}$ atoms/cm$^2$ to approximately $1.0\times10^{14}$ atoms/cm$^2$.

35. A structure as in claim 34, wherein said implant dose is in the range from approximately $5.0\times10^{12}$ atoms/cm$^2$ to approximately $4.0\times10^{13}$ atoms/cm$^2$.

36. A structure as in claim 21, wherein said image structure is a CCD imager.

37. A structure as in claim 21, wherein said image structure is a CMOS imager.

38. A structure as in claim 21, wherein said image structure comprises a photodiode, photogate or photoconductor.

39. A structure as in claim 21, wherein said image structure comprises a pnp photodiode.

40. A photodiode structure comprising:
   a first doped region having a first conductivity type formed in a substrate, said first doped region being in contact with a second doped region having said first conductivity type, said second doped region formed on a sidewall and bottom of a trench isolation region;

a third doped region with a second conductivity type that accumulates photo-generated charge formed beneath said first doped region and adjacent to said second doped region; and a fourth doped region having said first conductivity type formed at least in part beneath said second doped region.

41. The structure of claim 40, wherein said first conductivity type is p-type and said second conductivity type is n-type.

42. The structure of claim 40, wherein said first doped region has an implant dose in the range from approximately $3.0 \times 10^{12}$ atoms/cm$^2$ to approximately $1.0 \times 10^{14}$ atoms/cm$^2$.

43. The structure of claim 42, wherein said first doped region has an implant dose in the range from approximately $5.0 \times 10^{12}$ atoms/cm$^2$ to approximately $4.0 \times 10^{13}$ atoms/cm$^2$.

44. The structure of claim 40, wherein said second doped region has an implant dose in the range from approximately $3.0 \times 10^{11}$ atoms/cm$^2$ to approximately $1.0 \times 10^{13}$ atoms/cm$^2$.

45. The structure of claim 44, wherein said second doped region has an implant dose in the range from approximately $5.0 \times 10^{11}$ atoms/cm$^2$ to approximately $6.0 \times 10^{12}$ atoms/cm$^2$.

46. The structure of claim 40, wherein said third doped region has an implant dose in the range from approximately $1.0 \times 10^{12}$ atoms/cm$^2$ to approximately $1.0 \times 10^{14}$ atoms/cm$^2$.

47. The structure of claim 46, wherein said third doped region has an implant dose in the range from approximately $2.0 \times 10^{12}$ atoms/cm$^2$ to approximately $1.0 \times 10^{13}$ atoms/cm$^2$.

48. The structure of claim 40, wherein said fourth doped region has an implant concentration in the range from approximately $1.0 \times 10^{14}$ atoms/cm$^3$ to approximately $1.0 \times 10^{16}$ atoms/cm$^3$.

49. The structure of claim 48, wherein said third doped region has an implant concentration in the range from approximately $5.0 \times 10^{14}$ atoms/cm$^3$ to approximately $3.0 \times 10^{15}$ atoms/cm$^3$.

50. The structure of claim 40, further comprising a fifth doped region having said first conductivity type formed at least in part under said second doped region.

51. The structure of claim 50, wherein said fifth doped region has an implant dose in the range from approximately $5.0 \times 10^{11}$ atoms/cm$^2$ to approximately $5.0 \times 10^{13}$ atoms/cm$^2$.

52. The structure of claim 51, wherein said fifth doped region has an implant dose in the range from approximately $1.0 \times 10^{12}$ atoms/cm$^2$ to approximately $1.0 \times 10^{13}$ atoms/cm$^2$.

53. The structure of claim 50, wherein said first doped region and fifth doped region are electrically connected by said second doped region.

54. The structure of claim 40, wherein said first doped region and fourth doped region are electrically connected by said second doped region.

55. The structure of claim 40, wherein said third doped region is a charge collection region formed less than 0.30µ away from said second doped region.

56. The structure of claim 40, wherein said photodiode structure is part of a CMOS imager.

57. The structure of claim 40, wherein said photodiode structure is part of a CCD imager.

58. The structure of claim 40, wherein said second doped region surrounds at least a portion of a trench isolation region.

59. The structure of claim 40, wherein said photodiode structure is a p-n-p photodiode.

60. The structure of claim 40, wherein said photodiode structure is an n-p-n photodiode.

61. A processing system comprising: (i) a processor; and (ii) an imager pixel device coupled to said processor, said imager device comprising:

at least one isolation trench provided in a substrate having a first conductivity type, said substrate having a first dopant concentration;

a doped region having said first conductivity type surrounding at least a portion of said trench in said substrate, said doped region having a second dopant concentration; and a photosensitive region formed less than 0.30µ away from the at least one isolation trench and the doped region.

62. A processing system comprising: (i) a processor; and (ii) an imager structure coupled to said processor, said imager structure comprising:

a trench isolation region surrounded at least in part by a first doped region with a first conductivity type having a first impurity implant dose, wherein said first doped region is surrounded by a second doped region of said first conductivity type having a second impurity implant dose; and a charge collection region with a second conductivity type formed to be approximately less than 0.30µ away from said trench isolation region.

63. A photosensitive pixel comprising:

a p-n-p photodiode comprising an n-type charge collection region formed in a p-type substrate and a p-type surface region located above said charge collection region, said p-type substrate having a first implant dose and said p-type surface region having a second implant dose;

an isolation trench region laterally spaced apart by less than 0.30µ from said charge collection region; and a doped p-type implant region surrounding at least a portion of said isolation trench region, wherein said doped p-type implant region has a third implant dose.

* * * * *

UNITED STATES PATENT AND TRADEMARK OFFICE
CERTIFICATE OF CORRECTION

PATENT NO. : 7,102,184 B2
APPLICATION NO. : 10/694990
DATED : September 5, 2006
INVENTOR(S) : Howard E. Rhodes It is certified that error appears in the above-identified patent and that said Letters Patent is hereby corrected as shown below:

In the Drawings, replace the first four drawing sheets in the patent (Sheets 1-4) with the four attached Replacement Sheets.

In the Specification, the following errors are corrected:

Column 3, line 50, "26 to become" should read --26 become--;

Column 4, line 41, "pwell" should read --p-well--;

Column 5, line 30, "pwell" should read --p-well--;

Column 6, line 1, "views" should read --view--;

Column 6, line 3, "FIGS. 6A-6E" should read --FIGS. 6A-6M--;

Column 6, line 4, "views" should read --view--; and

Column 6, line 7, "views" should read --view--.

In the Claims, the following error is corrected:

Claim 61, column 20, line 16, "imager pixel device" should read --imager device--.

Signed and Sealed this

Second Day of January, 2007

JON W. DUDAS
*Director of the United States Patent and Trademark Office*